US008563085B2

(12) United States Patent
Cho et al.

(10) Patent No.: US 8,563,085 B2
(45) Date of Patent: Oct. 22, 2013

(54) PRECURSOR COMPOSITION, METHODS OF FORMING A LAYER, METHODS OF FORMING A GATE STRUCTURE AND METHODS OF FORMING A CAPACITOR

(75) Inventors: Youn-Joung Cho, Suwon-si (KR); Youn-Soo Kim, Yongin-si (KR); Kyu-Ho Cho, Hwaseong-si (KR); Jung-Ho Lee, Suwon-si (KR); Jae-Hyoung Choi, Hwaseong-si (KR); Seung-Min Ryu, Busan (KR)

(73) Assignee: Samsung Electronics Co., Ltd. (KR)

( * ) Notice: Subject to any disclaimer, the term of this patent is extended or adjusted under 35 U.S.C. 154(b) by 427 days.

(21) Appl. No.: 13/035,659

(22) Filed: Feb. 25, 2011

(65) Prior Publication Data

US 2011/0183527 A1    Jul. 28, 2011

Related U.S. Application Data

(63) Continuation-in-part of application No. 12/704,755, filed on Feb. 12, 2010, now abandoned, which is a continuation-in-part of application No. 12/542,813, filed on Aug. 18, 2009, now abandoned.

(51) Int. Cl.
*C23C 16/00*    (2006.01)

(52) U.S. Cl.
USPC ........... 427/255.28; 427/255.36; 427/255.394

(58) Field of Classification Search
USPC ............. 427/248.1, 255.26, 255.36, 255.394, 427/255.7
See application file for complete search history.

(56) References Cited

U.S. PATENT DOCUMENTS

| 5,187,300 A | 2/1993 | Norman |
| 6,238,734 B1 | 5/2001 | Senzaki et al. |
| 6,846,516 B2 | 1/2005 | Yang et al. |
| 2008/0003838 A1 | 1/2008 | Haukka et al. |
| 2009/0017208 A1 | 1/2009 | Shenai-Khatkhate et al. |
| 2010/0112211 A1 | 5/2010 | Xu et al. |

FOREIGN PATENT DOCUMENTS

| JP | 2008-069453 | 3/2008 |
| KR | 10-0249825 | 12/1999 |
| KR | 1020030000423 A | 1/2003 |

*Primary Examiner* — David Turocy
(74) *Attorney, Agent, or Firm* — Myers Bigel Sibley & Sajovec, P.A.

(57) ABSTRACT

In a method of forming a layer, a precursor composition including a metal and a ligand chelating to the metal is stabilized by contacting the precursor composition with an electron donating compound to provide a stabilized precursor composition onto a substrate. A reactant is introduced onto the substrate to bind to the metal in the stabilized precursor composition. The stabilized precursor composition is provided onto the substrate by introducing the precursor composition onto the substrate after the electron donating compound is introduced onto the substrate. The electron donating compound is continuously introduced onto the substrate during and after the precursor composition is introduced.

14 Claims, 24 Drawing Sheets

TIME

TIME

PRECURSOR COMPOSITION, METHODS OF FORMING A LAYER, METHODS OF FORMING A GATE STRUCTURE AND METHODS OF FORMING A CAPACITOR

REFERENCE TO PRIORITY APPLICATIONS

This application is a continuation-in-part of U.S. patent application Ser. No. 12/704,755, filed Feb. 12, 2010, now abandoned, which is a continuation-in-part of U.S. patent application Ser. No. 12/542, 813, filed Aug. 18, 2009, now abandoned, the contents of which are hereby incorporated herein by reference.

FIELD

The present invention relates to methods of forming metal compound layers on substrates and, more particularly, to methods of depositing metal compound layers using metal precursors and reactants.

BACKGROUND

Generally, semiconductor devices having a high integration degree and a rapid response speed are desirable. The technology of manufacturing the semiconductor devices has improved an integration degree, a reliability and/or a response speed of semiconductor devices. As the integration degree of the semiconductor devices increases, a design rule of the semiconductor devices may decrease.

The semiconductor devices generally may include conductive structures (e.g., wirings, plugs, conductive regions or electrodes) and insulation structures (e.g., dielectric layers, or insulating interlayers) that may electrically isolate the conductive structures. Forming such structures may employ a film deposition process. Examples of the film deposition process may include a physical vapor deposition (PVD) process, a chemical vapor deposition (CVD) process, or an atomic layer deposition (ALD) process.

The PVD process has an undesirable property in that it fills a hole, a gap or a trench, and thus generates a void in the hole, the gap or the trench. As the integration degree of the semiconductor device increases, a width of the hole may become narrow and an aspect ratio of the hole may be increased. When the width of the hole is small and the aspect ratio of the hole is large, a depositing material may be readily accumulated on an entrance of the hole to block the entrance of the hole prior to completely filling the inside of the hole and thus a void in the hole may be generated. The void may increase an electrical resistance of a conductive structure to deteriorate performance of the semiconductor device and to cause a defect of the semiconductor device. However, in the CVD process or the ALD process, filling the hole is superior when compared with the PVD process, and thus the CVD or PVD process may be employed in filling the hole, the gap or the trench in a semiconductor manufacturing process.

In the CVD process or the ALD process, a precursor is introduced into a chamber using a bubbling system or an injection system. For example, in the bubbling system, a precursor of a liquid state or a solid state is vaporized by bubbling the precursor with a carrier gas, and the vaporized precursor is introduced into the chamber with the carrier gas. That is, the precursor of the liquid state or the solid state is vaporized before introducing into the chamber to transform into the vapor state. As a result, the precursor is heated and a chamber maintains a high temperature during introduction of the precursor into the chamber. Thus, a high thermal stability may be required in the precursor used for forming the layer. When the precursor is unstable to heat and to be easily dissociated, it is difficult to control a process condition and to form a layer having a uniform thickness. Thus, electrical characteristics of the semiconductor devices may be deteriorated.

SUMMARY

Example embodiments provide a precursor composition having an improved thermal stability.

Example embodiments provide a method of forming a layer having a good step coverage by utilizing the precursor having an improved thermal stability.

Example embodiments provide a method of manufacturing a gate structure using the precursor having an improved thermal stability.

Example embodiments provide a method of manufacturing a capacitor using the precursor having an improved thermal stability.

According to example embodiments, there is provided a method of forming a layer. In the method, a precursor composition including a metal and a ligand chelating to the metal may be stabilized by contacting the precursor composition with an electron donating compound to provide a stabilized precursor composition onto a substrate. A reactant may be introduced onto the substrate to bind to the metal in the stabilized precursor composition. The stabilized precursor composition may be provided onto the substrate by introducing the precursor composition onto the substrate after the electron donating compound is introduced onto the substrate. The electron donating compound may be continuously introduced onto the substrate during and after the precursor composition is introduced.

In example embodiments, the precursor composition may include a first precursor having a first metal and a first ligand and a second precursor having a second metal and a second ligand.

In example embodiments, the first and second metals may include zirconium (Zr) or hafnium (Hf).

In example embodiments, a third precursor may be introduced onto the substrate after introducing the precursor composition onto the substrate. The third precursor may include a third metal and a third ligand.

In example embodiments, the third metal may include silicon (Si).

According to some example embodiments, a precursor including a metal and a ligand chelating to the metal may be stabilized by contacting the precursor with an electron donating compound to provide a stabilized precursor onto a substrate. A reactant may be introduced onto the substrate to bind to the metal in the stabilized precursor. The metal may include zirconium or hafnium and the electron donating compound may include alcohol having a carbon atom of about 1 to about 10.

According to some example embodiments, a precursor including a metal and a ligand chelating to the metal may be stabilized by contacting the precursor with an electron donating compound to provide a stabilized precursor onto a substrate. A reactant may be introduced onto the substrate to bind to the metal in the stabilized precursor. The precursor may include tetrakis-ethylmethylamido-zirconium (Zr(NCH3C2H5)4), tetrakis-ethylmethylamido-hafnium (Hf(NCH3C2H5)4), tetrakis-diethylamido-zirconium (Zr(N(C2H5)2)4), tetrakis-diethylamido-hafnium (Hf(N(C2H5)2)4), tetrakis-dimethylamido-zirconium (Zr(N(CH3)2)4), tetrakis-dimethylamido-hafnium (Hf(N(CH3)2)4), tetrakisethyldimethylamine-zirconium (Zr(N(CH3)2C2H5)4), tetrakis-ethyldimethylamine-hafnium (Hf(N(CH3)2C2H5)4), tetrakis-diethylmethylamine-zirconium (Zr(N(C2H5)2CH3)4), tetrakis-diethylmethylamine-hafnium (Hf(N(C2H5)2CH3)4), tetrakis-triethylamine-zirconium (Zr(N(C2H5)3)4), tetrakis-triethylamine-hafnium (Hf(N(C2H5)3)4), cyclopentadienyl-tris(dimethylamido)zirconium ((C5H5)Zr(N(CH3)2)3), cyclopentadienyl-tris(dimethylamido)hafnium ((C5H5)Hf(N(CH3)2)3), cyclopentadienyl-tris(ethylmethylamido)zirconium ((C5H5)Zr(N(C2H5)(CH3))3) or cyclopentadienyl-tris(ethylmethylamido)hafnium ((C5H5)Hf(N(C2H5)(CH3))3).

According to some example embodiments, a first precursor including a first metal and a first ligand chelating to the first metal may be provided onto a substrate. A second precursor including a second metal and a second ligand chelating to the second metal may be provided onto the substrate. An electron donating compound may be provided onto the substrate to stabilize the first and second precursors. A reactant having nitrogen may be provided onto the substrate to form a metal nitride layer on the substrate.

In example embodiments, the first precursor, the second precursor and the electron donating compound may be mixed to prepare a mixture composition. The mixture composition may be vaporized to provide stabilized precursors onto the substrate.

In example embodiments, a third precursor including a third metal and a third ligand chelating to the third metal may be further provided onto the substrate.

In example embodiments, the third metal may include silicon.

In example embodiments, the first precursor and the second precursor may be simultaneously provided during a same time interval. The electron donating compound may be provided after providing the first and the second precursors. The third precursor may be provided after providing the electron donating compound.

In example embodiments, the first precursor, the second precursor and the electron donating compound may be simultaneously provided during a same time interval, and then the third precursor may be provided after providing the first precursor, the second precursor and the electron donating compound.

In example embodiments, the first precursor and the second precursor may be provided during a same time interval. The third precursor may be provided after providing the first and the second precursors, and then the electron donating compound may be provided after providing the third precursor.

In example embodiments, the first precursor, the second precursor and the electron donating compound may be provided during a same time interval. The electron donating compound may be further provided after providing the first precursor, the second precursor and the electron donating compound, and then the electron donating compound and the third precursor may be simultaneously provided during a same time interval after further providing the electron donating compound.

BRIEF DESCRIPTION OF DRAWINGS

Example embodiments will be more clearly understood from the following detailed description taken in conjunction with the accompanying drawings.

FIGS. 1 to 33 illustrate non-limiting example embodiments as described herein, in which:

FIGS. 1 and 2 are flow charts illustrating a method of forming a layer in accordance with example embodiments;

FIGS. 3, 4 and 13 to 15 illustrate a method of forming a layer in accordance with example embodiments;

FIGS. 5 to 12 are timing sheets illustrating an introduction order and an introduction time interval of a precursor and an electron donating compound in accordance with example embodiments;

FIGS. 16 to 18 are cross-sectional views illustrating a method of forming a gate structure in accordance with example embodiments;

FIGS. 19 to 22 are cross-sectional views illustrating a method of manufacturing a capacitor in accordance with example embodiments;

FIG. 23 is a graph illustrating a thermal stability of precursor compositions 1 and 2 including tetrakis(ethylmethylamido)zirconium and ethyl methyl amine and a thermal stability of a comparative composition 1 including tetrakis(ethylmethylamido)zirconium;

FIG. 24 is a graph illustrating a thermal stability of a precursor composition 12 including tetrakis(ethylmethylamido)hafnium and ethyl methyl amine and a thermal stability of a comparative composition 2 including tetrakis(ethylmethylamido)hafnium;

FIG. 25 is a graph illustrating a thermal stability of a precursor composition 13 including tetrakis(ethylmethylamido)zirconium, tetrakis(ethylmethylamido)hafnium and ethyl methyl amine and a thermal stability of a comparative composition 3 including tetrakis(ethylmethylamido)zirconium and tetrakis(ethylmethylamido)hafnium;

FIGS. 26 and 27 illustrating $^1$H NMR spectrums of a precursor composition 1 including tetrakis-ethyl methyl amidozirconium and ethyl methyl amine;

FIGS. 28 and 29 illustrating $^1$H NMR spectrums of a precursor composition 16 tetrakis(ethylmethylamido)hafnium, tetrakis(ethylmethylamido)zirconium, tris(ethylmethylamino)silane and ethyl methyl amine;

FIG. 30 is a graph illustrating a ratio of solid residues weight with respect to a vaporized weight of the precursor composition 16 including tetrakis-ethyl methyl amidohafnium, tetrakis(ethylmethylamido)zirconium, tris(ethylmethylamino)silane and ethyl methyl amine;

FIG. 31 is a graph illustrating a thickness of a layer formed by an ALD process; and FIGS. 32 through 39 are scanning electron microscope (SEM) pictures illustrating a capacitor.

DESCRIPTION OF EMBODIMENTS

Figure 1:
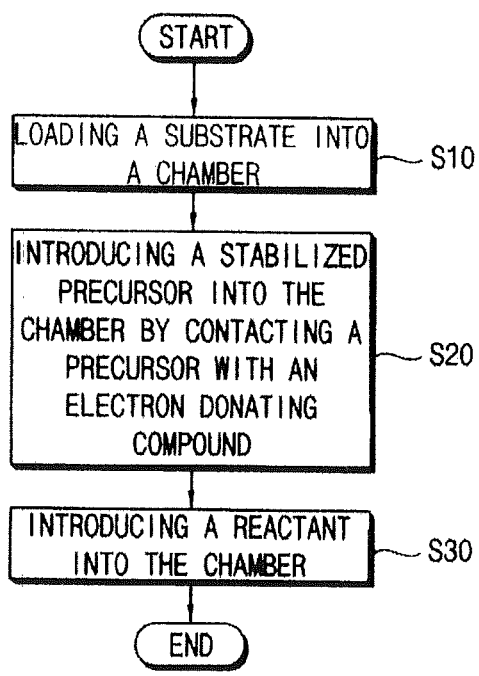

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a flow chart illustrating a method of forming a layer in accordance with example embodiments. Referring to FIG. 1, a substrate on which a layer will be formed is loaded in a chamber (S10). The substrate may include a semiconductor substrate such as silicon substrate, a germanium substrate, a silicon-germanium substrate, a silicon-on-insulator (SOI) substrate, a germanium-on-insulator (GOI) substrate, etc. Alternatively, the substrate may include a single crystalline metal oxide substrate. For example, the substrate may include a single crystalline aluminum oxide ($Al_2O_3$) substrate, a single crystalline strontium titanium oxide ($SrTiO_3$) substrate or a single crystalline magnesium oxide (MgO) substrate.

The substrate may be placed on a susceptor in the chamber. A temperature and/or a pressure of the chamber may be properly adjusted to perform a deposition process of the layer.

A precursor is contacted with an electron donating compound to provide a stabilized precursor on the substrate (S20). In example embodiments, the precursor includes a metal and a ligand coordinating to the metal. The metal in the precursor may be a material which will be included in the layer. The electron donating compound may provide an electron to the precursor to improve a thermal stability of the precursor.

The precursor may maintain a vapor state in the chamber before the precursor is chemisorbed on a surface of the substrate. Accordingly, when the precursor may be unstable to heat, the precursor may be decomposed before the precursor is chemisorbed on the surface of the substrate. When the precursor may be decomposed prior to being chemisorbed on the surface of the substrate, precipitates generated by a decomposition of the precursor may prevent diffusion of the precursor introduced into the chamber. For example, when the substrate has a stepped portion, precipitates caused by the decomposition of the precursor may be deposited on an upper portion of the stepped portion and thus the precursor may not be uniformly diffused into a lower portion of the stepped portion. Hence, the layer having a uniform thickness may not be formed along the profile of the stepped portion of the substrate. That is, a thick layer may be formed on an upper portion of the stepped portion to deteriorate a step coverage of the layer on the substrate. However, when the precursor is contacted with the electron donating compound, the precursor may not be decomposed at a high temperature atmosphere to maintain the vapor state in the chamber for a long time. Therefore, the stabilized precursor, which is formed by contacting the precursor with the electron donating compound, may be efficiently diffused into the lower portion of the stepped portion to form the layer having a good step coverage on the stepped portion of the substrate.

In example embodiments, the precursor may include the metal and the ligand coordinating to the metal. The metal may be adjusted according to properties of the layer formed on the substrate. The metal in the precursor may include lithium (Li), beryllium (Be), boron (B), sodium (Na), magnesium (Mg), aluminum (Al), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), tellurium (Te), cesium (Cs), barium (Ba), lanthanum (La), lanthanide (Ln), hafnium (Hf), tantalum (Ta), tungsten (W), rhenium (Re), osmium (Os), iridium (Ir), platinum (Pt), gold (Ag), thallium (Tl), mercury (Hg), lead (Pb), bismuth (Bi), polonium (Po), francium (Fr), radium (Ra), actinium (Ac) or actinide (An). For example, the metal may include zirconium or hafnium.

The ligand coordinating to the metal may be varied according to the metal to adjust a boiling point of the precursor. In example embodiments, the ligand may include a halogen such as fluoro ($F^-$), chloro ($Cl^-$), bromo ($Br^-$) or iodo ($I^-$), a hydroxyl group (OH), ammine ($NH_3$), an amine group having a carbon atom of about 1 to about 10, amido ($NH_2$) or an amido group in which an alkyl group having a carbon atom of about 1 to about 10 is substituted for a hydrogen atom, an alkoxy group having a carbon atom of about 1 to about 10, an alkyl group having a carbon atom of about 1 to about 10, an aryl group having a carbon atom of about 6 to about 12, an allyl group having a carbon atom of about 3 to about 15, a dienyl group having a carbon atom of about 4 to about 15, a β-diketonate group having a carbon atom of about 5 to about 20, a β-ketoiminato group having a carbon atom of about 5 to about 20 or a β-diiminato group having a carbon atom of about 5 to about 20. These may be used alone or in a mixture thereof. For example, the ligand may be dimethylamido ($N(CH_3)_2$), ethyl methyl amido ($NCH_3C_2H_5$), diethylamido ($N(C_2H_5)_2$), ethyl dimethyl amine ($N(CH_3)_2C_2H_5$), diethyl methyl amine ($N(C_2H_5)_2CH_3$) or triethylamine ($N(C_2H_5)_3$).

In forming the layer, at least one type of the precursor may be used. In one example embodiment, one type of the precursor may be used for forming the layer. When one type of the precursor is used for forming the layer, the layer may include one type of a metal compound. For example, the precursor may include zirconium or hafnium. In another example embodiment, two types of the precursors may be used for forming the layer. Here, the precursor may include a first precursor including a first metal and a second precursor including a second metal substantially different from the first metal. For example, the precursor may include the first precursor including zirconium as the first metal and the second precursor including hafnium as the second metal. In still another example embodiment, the precursor may include a first precursor including a first metal, a second precursor including a second metal substantially different from the first metal and a third precursor including a third metal substantially different from the first metal and the second metal. For example, the precursor may include the first precursor including zirconium as the first metal, the second precursor including hafnium as the second metal and the third precursor including silicon as the third metal. When the third precursor is further included in the precursor, the layer formed using the precursor may have improved electrical characteristics.

In example embodiments, the precursor having the metal and the ligand may include tetrakis(ethylmethylamido)zirconium ($Zr(NCH_3C_2H_5)_4$), tetrakis(ethylmethylamido)hafnium ($Hf(NCH_3C_2H_5)_4$), tetrakis(diethylamido)zirconium ($Zr(N(C_2H_5)_2)_4$), tetrakis(diethylamido)hafnium ($Hf(N(C_2H_5)_2)_4$), tetrakis(dimethylamido)zirconium ($Zr(N(CH_3)_2)_4$), tetrakis(dimethylamido)hafnium ($Hf(N(CH_3)_2)_4$), tetrakis(ethyldimethylamine)zirconium ($Zr(N(CH_3)_2C_2H_5)_4$), tetrakis(ethyldimethylamine)hafnium ($Hf(N(CH_3)_2C_2H_5)_4$), tetrakis(diethylmethylamine)zirconium ($Zr(N(C_2H_5)_2CH_3)_4$), tetrakis(diethylmethylamine)hafnium ($Hf(N(C_2H_5)_2CH_3)_4$), tetrakis(triethylamine)zirconium ($Zr(N(C_2H_5)_3)_4$), tetrakis(triethylamine)hafnium ($Hf(N(C_2H_5)_3)_4$), cyclopentadienyl-tris(dimethylamido)zirconium ($(C_5H_5)Zr(N(CH_3)_2)_3$), cyclopentadienyl-tris(dimethylamido)hafnium ($(C_5H_5)Hf(N(CH_3)_2)_3$), cyclopentadienyl-tris(ethylmethylamido)zirconium ($(C_5H_5)Zr(N(C_2H_5)(CH_3))_3$) or cyclopentadienyl-tris(ethylmethylamido)hafnium ($(C_5H_5)Hf(N(C_2H_5)(CH_3))_3$). These may be used alone or in a mixture thereof.

The electron donating compound may have a lone pair electron or a high electron density to donate an electron to a portion having a positive charge or an electron deficiency portion of the precursor. Various materials capable of providing an electron may be used as the electron donating compound. When the electron donating compound donates an electron to the metal of the precursor, an intermolecular interaction between the metal of the precursor and the electron donating compound may be generated to stabilize the precursor. The intermolecular interaction between the metal of the precursor and the electron donating compound may be substantially weaker than a bonding force between the metal and the ligand in the precursor. Therefore, when the precursor is chemisorbed onto the surface of the substrate or is reacted with other reactants, the intermolecular interaction between the metal of the precursor and the electron donating compound may be easily removed to detach the electron donating compound from the precursor.

The electron donating compound may include a compound having a lone pair electron or an electron-rich compound such as allyl compound, an aryl compound, a diene compound or β-diketone compound. In example embodiments, the electron donating compound may be water, hydrogen halide, an alcohol compound having a carbon atom of about 1 to about 10, an ether compound having a carbon atom of about 2 to about 10, a ketone compound having a carbon atom of about 3 to about 10, an aryl compound having a carbon atom of about 6 to about 12, an allyl compound having a carbon atom of about 3 to about 15, a diene compound having a carbon atom of about 4 to about 15, a β-diketone compound having a carbon atom of about 5 to about 20, a β-ketoimine compound having a carbon atom of about 5 to about 20, a β-diimine compound having a carbon atom of about 5 to about 20, ammonia or an amine compound having a carbon compound of about 1 to about 10. These may be used alone or in a mixture thereof. Hydrogen halide may include hydrogen fluoride, hydrogen chloride, hydrogen bromide or hydrogen iodide. The diene compound may include cyclopentadiene or a cyclopentadiene in which an alkyl compound having a carbon atom of about 1 to about 10 is substituted for a hydrogen atom. The alcohol compound may include ethanol, methanol or butanol. The amine compound having a carbon atom of about 1 to about 10 may include a primary amine, a secondary amine or tertiary amine. For example, the electron donating compound may include diethyl amine, dimethyl amine, ethyl methyl amine, ethyl dimethyl amine, diethyl methyl amine or triethyl amine.

In example embodiments, when the precursor including zirconium or hafnium is contacted with the electron donating compound, zirconium or hafnium in the precursor may interact with the electron donating compound as illustrated in formula (1) to improve a thermal stability of the precursor.

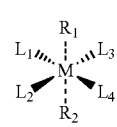

(1)

In the formula (1), M may represent a central metal such as zirconium or hafnium. $L_1$ to $L_4$ may be a ligand coordinating to the central metal and independently represent fluoro ($F^-$), chloro ($Cl^-$), bromo ($Br^-$), iodo ($I^-$), an alkoxy group having a carbon atom of about 1 to about 10, an aryl group having a carbon atom of about 6 to about 12, an allyl group having a carbon atom of about 3 to about 15, a dienyl group having a carbon atom of about 4 to about 15, a β-diketonate group having a carbon atom of about 5 to about 20, a β-ketoiminato group having a carbon atom of about 5 to about 20, a β-diiminato group having a carbon atom of about 5 to about 20, a hydroxyl group (OH), amine ($NH_3$), an amine group having a carbon atom of about 1 to 10, an amido group ($NH_2$) or an amido group in which an alkyl group having a carbon atom of about 1 to about 10 is substituted for a hydrogen atom. $R_1$ and $R_2$ may be an electron donating compound which interact with the central metal to stabilize the precursor and independently represent water ($H_2O$), hydrogen fluoride (HF), hydrogen chloride (HCl), hydrogen bromide (HBr), hydrogen iodide (HI), an alcohol compound having a carbon atom of about 1 to about 10, an ether compound having a carbon atom of about 2 to about 10, a ketone compound having a carbon atom of about 3 to about 10, an aryl compound having a carbon atom of about 6 to about 12, an allyl compound having a carbon atom of about 3 to about 15, a diene compound having a carbon atom of about 4 to about 15, a β-diketone compound having a carbon atom of about 5 to about 20, a β-ketoimine compound having a carbon atom of about 5 to about 20, a β-diimine compound having a carbon atom of about 5 to about 20, ammonia or an amine compound having a carbon atom of about 1 to about 10. For example, $L_1$ to $L_4$ may be dimethyl amido, diethyl amido, ethyl methyl amido, ethyl dimethyl amine, diethyl methyl amine or triethyl amine and $R_1$ and $R_2$ may be dimethyl amine, diethyl amine, ethyl methyl amine, ethyl dimethyl amine, diethyl methyl amine or triethylamine.

As illustrated in formula (1), zirconium or hafnium may have a coordination number of four. Therefore, zirconium or hafnium may coordinate to four ligands to form a precursor. When the precursor is contacted with the electron donating compound, the electron donating compound may donate an electron to zirconium or hafnium to stabilize the precursor. Hence, when the precursor is contacted with the electron donating compound, the stabilized precursor may have an octahedral structure similar to that of a complex compound including a central metal and six ligands coordinating to the central metal. However, the intermolecular interaction between zirconium or hafnium and the electron donating compound may be substantially weaker than a bonding force between zirconium or hafnium and the ligand.

In one example embodiment, the precursor may be contacted with the electron donating compound before the precursor is introduced into the chamber. The precursor and the electron donating compound may be a solid state or a liquid state at a room temperature. When the precursor and the electron donating compound are in a liquid state at a room temperature, a precursor composition may be formed by mixing the precursor and the electron donating compound to stabilize the precursor. When the precursor is in a solid state at a room temperature, the precursor may be heated to a melting point to be transformed into the liquid state. A precursor composition may be formed by mixing the precursor in the liquid state and the electron donating compound to stabilize the precursor. In other example embodiment, the precursor may be contacted with the electron donating compound in the chamber. For example, after the precursor and the electron donating compound are vaporized to be introduced into the chamber, respectively, the vaporized precursor may be contacted with the vaporized electron donating compound in the chamber to stabilize the precursor.

The stabilized precursor is provided on the substrate. When the precursor and the electron donating compound are mixed to form the precursor composition, the stabilized precursor may be introduced into the chamber by vaporizing the precursor composition to provide the stabilized precursor onto the substrate. When the vaporized precursor and the vaporized electron donating compound are introduced into the chamber, respectively, the stabilized precursor may be provided onto the substrate by contacting the vaporized precursor with the vaporizing electron donating compound in the chamber.

A reactant is introduced into the chamber to form a layer on the substrate (S30). The reactant may bind to the metal to form a metal compound. When the layer is formed using the precursor stabilized by the electron donating compound, the layer may have a good step coverage.

A reactant may be adjusted by properties of the layer. When the layer is a metal oxide layer, the reactant may include an oxidant such as water or water vapor ($H_2O$), ozone ($O_3$), oxygen ($O_2$), an oxygen plasma or an ozone plasma, etc. When the layer is a metal nitride layer, the reactant may include ammonia ($NH_3$), nitrogen dioxide ($NO_2$) or nitrous oxide ($N_2O$), etc. When the reactant is introduced into the chamber, the reactant may be substituted for the ligand to form the metal oxide layer or the metal nitride layer on the substrate.

According to example embodiments, when the precursor composition including at least two types of the precursors is used, a composite layer including at least two metals may be formed. For example, when the precursor includes a first precursor including zirconium and a second precursor including hafnium and the reactant includes an oxidant including an oxygen atom, the oxide layer including zirconium-hafnium oxide may be formed on the substrate. Alternatively, when the precursor includes a first precursor including zirconium, a second precursor including hafnium and a third precursor includes silicon and the reactant includes an oxidant including an oxygen atom, the oxide layer including zirconium-hafnium silicate may be formed on the substrate.

In one example embodiment, the layer may be formed by a chemical vapor deposition (CVD) process. That is, after the ligand in the precursor is replaced with the reactant to form the metal compound, the metal compound may be chemisorbed onto the substrate. In other example embodiment, the layer may be formed by an atomic layer deposition (ALD) process. That is, after the stabilized precursor is chemisorbed on the substrate, the ligand in the chemisorbed precursor may be replaced with the reactant to form the layer on the substrate.

According to example embodiments, the layer may be formed using the precursor stabilized by the electron donating compound. The electron donating compound may improve the thermal stability of the precursor and thus the precursor may not be decomposed at a high temperature for a long time without change to a structure or properties of the precursor. Hence, when the layer is formed using the stabilized precursor, precipitates caused by decomposition of the precursor may not be deposited to prevent the precipitates from filling a hole, a gap, a trench or a recess. Further, the precursor may be diffused into the lower portion of the stepped portion to form the layer having a uniform thickness.

Figure 2:
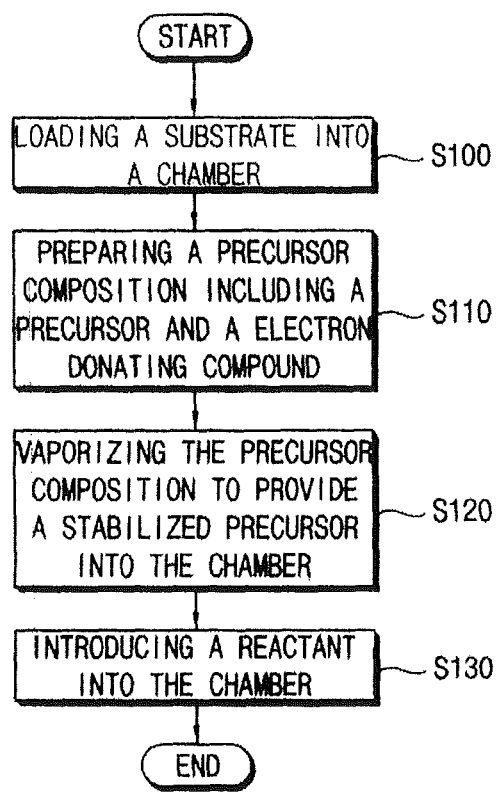

FIG. 2 is a flow chart illustrating a method of forming a layer in accordance with example embodiments. Referring to FIG. 2, a substrate on which a layer will be formed is loaded in a chamber (S100). The substrate may include a semiconductor substrate such as silicon substrate, a germanium substrate, a silicon-germanium substrate, a silicon-on-insulator (SOI) substrate, a germanium-on-insulator (GOI) substrate, etc. Alternatively, the substrate may include a single crystalline metal oxide substrate. For example, the substrate may include a single crystalline aluminum oxide ($Al_2O_3$) substrate, a single crystalline strontium titanium oxide ($SrTiO_3$) substrate or a single crystalline magnesium oxide (MgO) substrate.

Referring to FIG. 2, a precursor and an electron donating compound are mixed to prepare a precursor solution (S110). The precursor includes a metal and a ligand coordinating to the metal. The electron donating compound may provide an electron to the precursor to improve a thermal stability of the precursor.

In example embodiments, the precursor may include the metal and the ligand coordinating to the metal. The metal may be adjusted according to properties of the layer formed on the substrate. The metal in the precursor may include lithium, beryllium, boron, sodium, magnesium, aluminum, potassium, calcium, scandium, titanium, vanadium, chromium, manganese, iron, cobalt, nickel, copper, zinc, gallium, germanium, rubidium, strontium, yttrium, zirconium, niobium, molybdenum, technetium, ruthenium, rhodium, palladium, silver, cadmium, indium, tin, antimony, tellurium, cesium, barium, lanthanum, lanthanide, hafnium, tantalum, tungsten, rhenium, osmium, iridium, platinum, gold, thallium, mercury, lead, bismuth, polonium, francium, radium, actinium or actinide. For example, the metal may include zirconium or hafnium.

The ligand coordinating to the metal may be varied according to the metal to adjust a boiling point of the precursor. In example embodiments, the ligand may include a halogen such as fluoro, chloro, bromo or iodo, a hydroxyl group, amine, an amine group having a carbon atom of about 1 to about 10, amido or an amido group in which an alkyl group having a carbon atom of about 1 to about 10 is substituted for a hydrogen atom, an alkoxy group having a carbon atom of about 1 to about 10, an alkyl group having a carbon atom of about 1 to about 10, an aryl group having a carbon atom of about 6 to about 12, an allyl group having a carbon atom of about 3 to about 15, a dienyl group having a carbon atom of about 4 to about 15, a β-diketonate group having a carbon atom of about 5 to about 20, a β-ketoiminato group having a carbon atom of about 5 to about 20 or a β-diiminato group having a carbon atom of about 5 to about 20. These may be used alone or in a mixture thereof. For example, the ligand may be dimethylamido ($N(CH_3)_2$), ethyl methyl amido ($NCH_3C_2H_5$), diethylamido ($N(C_2H_5)_2$), ethyl dimethyl amine ($N(CH_3)_2C_2H_5$), diethyl methyl amine ($N(C_2H_5)_2CH_3$) or triethylamine ($N(C_2H_5)_3$).

In example embodiments, the precursor having the metal and the ligand may include tetrakis(ethylmethylamido)zirconium ($Zr(NCH_3C_2H_5)_4$), tetrakis(ethylmethylamido)hafnium ($Hf(NCH_3C_2H_5)_4$), tetrakis(diethylamido)zirconium ($Zr(N(C_2H_5)_2)_4$), tetrakis(diethylamido)hafnium ($Hf(N(C_2H_5)_2)_4$), tetrakis(dimethylamido)zirconium ($Zr(N(CH_3)_2)_4$), tetrakis(dimethylamido)hafnium ($Hf(N(CH_3)_2)_4$), tetrakis(ethyldimethylamine)zirconium ($Zr(N(CH_3)_2C_2H_5)_4$), tetrakis(ethyldimethylamine)hafnium ($Hf(N(CH_3)_2C_2H_5)_4$), tetrakis(diethylmethylamine)zirconium ($Zr(N(C_2H_5)_2CH_3)_4$), tetrakis(diethylmethylamine)hafnium ($Hf(N(C_2H_5)_2CH_3)_4$), tetrakis(triethylamine)zirconium ($Zr(N(C_2H_5)_3)_4$), tetrakis(triethylamine)hafnium ($Hf(N(C_2H_5)_3)_4$), cyclopentadienyl-tris(dimethylamido)zirconium ($(C_5H_5)Zr(N(CH_3)_2)_3$), cyclopentadienyl-tris(dimethylamido)hafnium ($(C_5H_5)Hf(N(CH_3)_2)_3$), cyclopentadienyl-tris(ethylmethylamido)zirconium ($(C_5H_5)Zr(N(C_2H_5)(CH_3))_3$) or cyclopentadienyl-tris(ethylmethylamido)hafnium ($(C_5H_5)Hf(N(C_2H_5)(CH_3))_3$). These may be used alone or in a mixture thereof.

In example embodiments, the electron donating compound may be water, hydrogen halide, an alcohol compound having a carbon atom of about 1 to about 10, an ether compound having a carbon atom of about 2 to about 10, a ketone compound having a carbon atom of about 3 to about 10, an aryl compound having a carbon atom of about 6 to about 12, an allyl compound having a carbon atom of about 3 to about 15, a diene compound having a carbon atom of about 4 to about 15, a β-diketone compound having a carbon atom of about 5 to about 20, a β-ketoimine compound having a carbon atom of about 5 to about 20, a β-diimine compound having a carbon atom of about 5 to about 20, ammonia or a amine compound having a carbon atom of about 1 to about 10. Theses may be used alone or in a mixture thereof. Hydrogen halide may include hydrogen fluoride, hydrogen chloride, hydrogen bromide or hydrogen iodide. The diene compound may include cyclopentadiene or a cyclopentadiene in which an alkyl compound having a carbon atom of about 1 to about 10 is substituted for a hydrogen atom. The alcohol compound may include ethanol, methanol or butanol. The amine compound having a carbon atom of about 1 to about 10 may include a primary amine, a secondary amine or tertiary amine. For example, the electron donating compound may include diethyl amine, dimethyl amine, ethyl methyl amine, ethyl dimethyl amine, diethyl methyl amine or triethyl amine.

The precursor and the electron donating compound may be in a liquid state or in a solid state. When the precursor is in the solid state, the precursor may be dissolved into the electron donating compound in the liquid state to prepare a solution. The solution may be heated at a temperature between a melting point of the precursor and a boiling point of the electron donating compound to prepare a precursor composition. When both the precursor and the electron donating compound are in the liquid state, the precursor and the electron donating compound are mixed according to a predetermined ratio to prepare a precursor composition. In example embodiments, when the metal included in the precursor is zirconium or hafnium, the ligand may include diethylamido, dimethylamido, ethyl methyl amido, ethyl dimethyl amine, diethyl methyl amine or triethylamine and the electron donating compound may include a primary amine, a secondary amine or a tertiary amine having a carbon atom of about 1 to about 10, the precursor solution may be easily prepared because the precursor and the electron donating compound are in the liquid state at a room temperature.

In example embodiments, the precursor and the electron donating compound in the precursor composition may have a mole ratio of about 1:0.01 to about 1:12. When the precursor and the electron donating compound in the precursor composition may have a mole ratio less than about 1:0.01, the precursor may not be efficiently stabilized by the electron donating compound. The precursor and the electron donating compound in the precursor composition may have a mole ratio of about 1:0.5 to about 1:5.

The precursor composition may include at least one type precursor. In one example embodiment, the precursor composition may include one type of the precursor and the electron donating compound. For example, the precursor composition may include the precursor including zirconium and the electron donating compound. Alternatively, the precursor composition may include the precursor including hafnium and the electron donating compound. In another example embodiment, the precursor composition may include two types of the precursors and the electron donating compound. Here, the precursor composition may include a first precursor including a first metal, a second precursor including a second metal substantially different from the first metal, and the electron donating compound. For example, the precursor composition may include the first precursor including zirconium, the second precursor including hafnium and the electron donating compound. In still another example embodiment, the precursor composition may include a first precursor including a first metal, a second precursor including a second metal substantially different from the first metal, a third precursor including a third metal substantially different from the first metal and the second metal, and the electron donating compound. For example, the precursor composition may include the first precursor including zirconium, the second precursor including hafnium, the third precursor including silicon, and the electron donating compound.

Referring to FIG. 2, the precursor composition is vaporized to provide a stabilized precursor on the substrate in the chamber (S120).

In example embodiments, the stabilized precursor may be provided on the substrate in the chamber using a bubbling system, an injection system or a liquid delivery system (LDS). For example, when the stabilized precursor may be provided on the substrate using the liquid delivery system, the precursor composition including the precursor and the electron donating compound are carried into a vaporizer in a canister to be vaporized. Then, the stabilized precursor in a vapor state may be introduced into the chamber with a carrier gas. A thermal stability of the stabilized precursor may be improved by an electron of the electron donating compound. Accordingly, when a temperature of the precursor solution or a temperature of the vaporizer is rapidly increased, the stabilized precursor may not be dissociated for a long time. Additionally, the stabilized precursor may not be dissociated in the chamber having a high temperature atmosphere unless a reactant is introduced into the chamber. However, when the precursor is not mixed with the electron donating compound, the precursor may be easily dissociated because the precursor does not have an improved thermal stability. Thus, the precursor may be dissociated in the canister or the vaporizer while vaporizing the precursor. Additionally, a dissociated precursor may be attached on a gas line connected with the chamber. In accordance with example embodiments, the precursor may be contacted with the electron donating compound before the precursor is introduced into the chamber to have an improved thermal stability. Thus, the vaporized precursor may be efficiently carried into the chamber in which the substrate is loaded.

The carrier gas which is introduced with the vaporized precursor may be an inactive gas. For example, the carrier gas may include an argon gas, a helium gas, a nitrogen gas or a neon gas. These may be used alone or in a mixture thereof.

A flow rate of the carrier gas may be adjusted according to a deposition rate of the layer, a vapor pressure of the precursor or a temperature of the chamber. For example, the carrier gas may be introduced into chamber with a flow rate of about 200 standard cubic centimeters per minute (sccm) to about 1,300 sccm for about 3 seconds to about 10 seconds.

An interior of the chamber may have a substantially higher temperature than that of the canister or the gas line through which the vaporized precursor is introduced in the chamber. When the vaporized precursor is introduced into the interior of the chamber, the precursor may be dissociated in the chamber to generate precipitates. However, the precursor stabilized by the electron donating compound may have an improved thermal stability, and thus the stabilized precursor may not be dissociated in the chamber having a high temperature atmosphere.

According to example embodiments, after the precursor composition is introduced onto the substrate, a precursor including a metal substantially different from the metal of the precursor included in the precursor composition may be further introduced onto the substrate. When the precursor composition includes at least one of the precursor including zirconium or hafnium and the electron donating compound, a precursor including silicon may be vaporized to be introduced onto the substrate. Here, the layer including zirconium and silicon, the layer including hafnium and silicon, or the layer including zirconium, hafnium and silicon may be formed on the substrate.

After the precursor composition including the electron donating compound is vaporized to provide the stabilized precursor onto the substrate, the electron donating compound may be further provided onto the substrate. When the electron donating compound is further provided onto the substrate, the precursor included in the precursor composition may be further stabilized by the electron donating compound. For example, after the precursor composition is vaporized to provide the stabilized precursor onto the substrate, the electron donating compound may be vaporized to be further introduced onto the substrate.

In one example embodiment, when the layer is formed by an ALD process, after the stabilized precursor is provided into the chamber, a first purge gas may be introduced into the chamber. In the ALD process, the precursor may be chemisorbed on the substrate by introducing the stabilized precursor into the chamber. Then, the first purge gas may be introduced into the chamber to remove a non-chemisorbed precursor from the chamber.

In another example embodiment, when the layer is formed by a CVD process, after the stabilized precursor is provided into the chamber, a first purge gas may not be introduced into the chamber.

Referring to FIG. 2, a reactant binding to the metal in the precursor is introduced into the chamber (S130). The reactant may be adjusted according to properties of the layer. When the layer is an oxide layer, the reactant may include ozone ($O_3$), oxygen ($O_2$), water ($H_2O$), an oxygen plasma, an ozone plasma, etc. These may be used alone or in a mixture thereof. When the layer is a nitride layer, the reactant may include ammonia ($NH_3$), nitrogen dioxide ($NO_2$) or nitrous oxide ($N_2O$), etc.

When the reactant is introduced into the chamber, the reactant may bind to the metal in the precursor by substituting for the ligand in the precursor to form the layer on the substrate.

In example embodiments, after the reactant is introduced into the chamber, a second purge gas is provided on the substrate in the chamber. The introduction of the second purge gas may remove a remaining reactant which does not bind to the metal in the precursor or the precursor which does not chemisorbed on the substrate.

According to example embodiments, before the precursor is introduced into the chamber, the precursor composition may be prepared by mixing the precursor and the electron donating compound to form the stabilized precursor. The precursor stabilized by the electron donating compound may have improved thermal stability. Furthermore, the stabilized precursor may not be dissociated at a high temperature atmosphere when the stabilized precursor is the liquid state or the vapor state. As a result, the stabilized precursor may not be dissociated while vaporizing the precursor and thus the precipitates caused by a dissociation of the precursor may be prevented from depositing on the canister or the gas line connected to the chamber. Additionally, the stabilized precursor of the vapor state may not be dissociated in the chamber having a high temperature atmosphere because the stabilized precursor of the vapor state may have improved thermal stability. Thus, the precipitates caused by a dissociation of the precursor may be prevented from depositing on the substrate or the chamber. Further, the stabilized precursor may maintain the vapor state without dissociation to be uniformly diffused into a lower portion of a hole, a trench, a gap or a recess.

Hereinafter, a method of forming a layer in accordance with example embodiments will be explained in detail with reference to the accompanying drawings.

FIGS. 3, 4 and 13 to 15 illustrate a method of forming a layer in accordance with example embodiments. FIGS. 5 to 12 are timing sheets illustrating an introduction order and an introduction time interval of a precursor and an electron donating compound in accordance with example embodiments.

Figure 3:
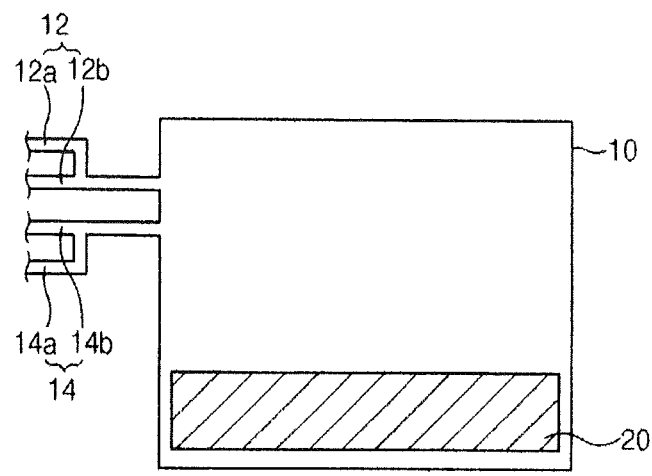

Referring to FIG. 3, a substrate 20 is loaded into a chamber 10. The chamber 10 may include gas lines 12 and 14 for introducing a gas into the chamber 10. In example embodiments, the gas lines 12 and 14 may include a first gas line 12 and a second gas line 14. The first gas line 12 may includes a first diverged line 12a and a second diverged line 12b. A precursor 32 and an electron donating compound 34 (see FIG. 4) may be introduced into the chamber 10 through the first diverged line 12a and a first purge gas may be introduced into the chamber 10 through the second diverged line 12b. The second gas line 14 may include a third diverged line 14a and a fourth diverged line 14b. A reactant 50 (see FIG. 4) binding to a metal 32a (see FIG. 4) in the precursor 32 may be introduced into the chamber 10 through the third diverged line 14a and a second purge gas may be introduced into the chamber 10 through the fourth diverged line 14b.

Figure 4:
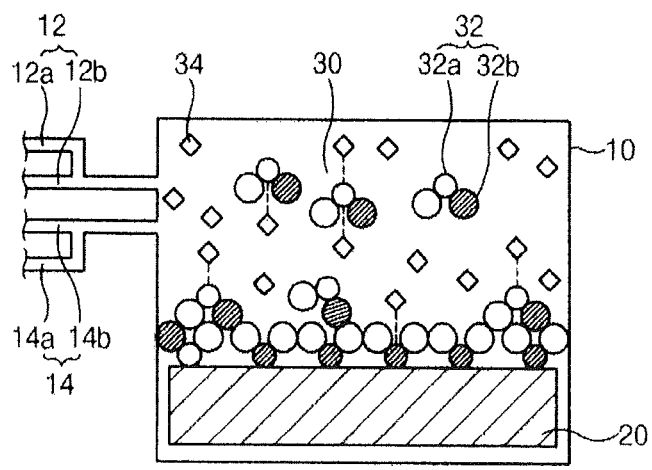

Referring to FIG. 4, the precursor 32 and the electron donating compound 34 are introduced into the chamber 10 to provide a stabilized precursor 30 on the substrate 20. When the precursor 32 of a vapor state is contacted with the electron donating compound 34 of a vapor state on the substrate 20, the electron donating compound 34 may donate an electron to the metal 32a in the precursor 32 to generate an intermolecular interaction between the electron donating compound 34 and the precursor 32. The stabilized precursor 30 may have an improved thermal stability and thus the stabilized precursor may not be dissociated at a high temperature atmosphere.

In example embodiments, the precursor 32 includes the metal 32a and a ligand 32b coordinating to the metal 32a. The metal 32a may be adjusted according to properties of the layer formed on the substrate 20. The metal 32a in the precursor 32 may include lithium, beryllium, boron, sodium, magnesium, aluminum, potassium, calcium, scandium, titanium, vanadium, chromium, manganese, iron, cobalt, nickel, copper, zinc, gallium, germanium, rubidium, strontium, yttrium, zirconium, niobium, molybdenum, technetium, ruthenium, rhodium, palladium, silver, cadmium, indium, tin, antimony, tellurium, cesium, barium, lanthanum, lanthanide, hafnium, tantalum, tungsten, rhenium, osmium, iridium, platinum, gold, thallium, mercury, lead, bismuth, polonium, francium, radium, actinium or actinide. For example, the metal may include zirconium or hafnium.

The ligand 32b coordinating to the metal 32a may be varied according to the metal 32a to adjust a boiling point of the precursor 32. In example embodiments, the ligand 32b may include a halogen such as fluoro, chloro, bromo or iodo, a hydroxyl group, amine, an amine group having a carbon atom of about 1 to about 10, amido or an amido group in which an alkyl group having a carbon atom of about 1 to about 10 is substituted for a hydrogen atom, an alkoxy group having a carbon atom of about 1 to about 10, an alkyl group having a carbon atom of about 1 to about 10, an aryl group having a carbon atom of about 6 to about 12, an allyl group having a carbon atom of about 3 to about 15, a dienyl group having a carbon atom of about 4 to about 15, a β-diketonate group having a carbon atom of about 5 to about 20, a β-ketoiminato group having a carbon atom of about 5 to about 20 or a β-diiminato group having a carbon atom of about 5 to about 20. These may be used alone or in a mixture thereof. For example, the ligand may include dimethylamido ($N(CH_3)_2$), ethyl methyl amido ($NCH_3C_2H_5$), diethylamido ($N(C_2H_5)_2$), ethyl dimethyl amine ($N(CH_3)_2C_2H_5$), diethyl methyl amine ($N(C_2H_5)_2CH_3$) or triethylamine ($N(C_2H_5)_3$).

In example embodiments, the precursor having the metal and the ligand may include tetrakis(ethylmethylamido)zirconium ($Zr(NCH_3C_2H_5)_4$), tetrakis(ethylmethylamido) hafnium ($Hf(NCH_3C_2H_5)_4$), tetrakis(diethylamido)zirconium ($Zr(N(C_2H_5)_2)_4$), tetrakis(diethylamido)hafnium ($Hf(N(C_2H_5)_2)_4$), tetrakis(dimethylamido)zirconium ($Zr(N(CH_3)_2)_4$), tetrakis(dimethylamido)hafnium ($Hf(N(CH_3)_2)_4$), tetrakis(ethyldimethylamine)zirconium ($Zr(N(CH_3)_2C_2H_5)_4$), tetrakis(ethyldimethylamine)hafnium ($Hf(N(CH_3)_2C_2H_5)_4$), tetrakis(diethylmethylamine)zirconium ($Zr(N(C_2H_5)_2CH_3)_4$), tetrakis(diethylmethylamine)hafnium ($Hf(N(C_2H_5)_2CH_3)_4$), tetrakis(triethylamine)zirconium ($Zr(N(C_2H_5)_3)_4$), tetrakis(triethylamine)hafnium ($Hf(N(C_2H_5)_3)_4$), cyclopentadienyl-tris(dimethylamido)zirconium ($(C_5H_5)Zr(N(CH_3)_2)_3$), cyclopentadienyl-tris(dimethylamido)hafnium ($(C_5H_5)Hf(N(CH_3)_2)_3$), cyclopentadienyl-tris(ethylmethylamido)zirconium ($(C_5H_5)Zr(N(C_2H_5)(CH_3))_3$) or cyclopentadienyl-tris(ethylmethylamido)hafnium ($(C_5H_5)Hf(N(C_2H_5)(CH_3))_3$). These may be used alone or in a mixture thereof.

In example embodiments, the electron donating compound may be water, hydrogen halide, an alcohol compound having a carbon atom of about 1 to about 10, an ether compound having a carbon atom of about 2 to about 10, a ketone compound having a carbon atom of about 3 to about 10, an aryl compound having a carbon atom of about 6 to about 12, an allyl compound having about 3 to about 15, a diene compound having a carbon atom of about 4 to about 15, a β-diketone compound of having a carbon atom of about 5 to about 20, a β-ketoimine compound having a carbon atom of about 5 to about 20, a β-diimine compound having a carbon atom of about 5 to about 20, ammonia or a amine compound having a carbon compound of about 1 to about 10. Theses may be used alone or in a mixture thereof. Hydrogen halide may include hydrogen fluoride, hydrogen chloride, hydrogen bromide or hydrogen iodide. The diene compound may include cyclopentadiene or a cyclopentadiene in which an alkyl compound having a carbon atom of about 1 to about 10 is substituted for a hydrogen atom. The alcohol compound may include ethanol, methanol or butanol. The amine compound having a carbon atom of about 1 to about 10 may include a primary amine, a secondary amine or a tertiary amine. For example, the electron donating compound may include diethyl amine, dimethyl amine, ethyl methyl amine, ethyl dimethyl amine, diethyl methyl amine or triethyl amine.

In example embodiments, the precursor 32 may be introduced into the chamber 10 with a flow rate of about 50 sccm to about 1,000 sccm for about 0.1 second to about 10 seconds. The precursor 32 of a liquid state may be maintained outside of the chamber 10, e.g. a canister at a temperature of about 50° C. to about 90° C. The precursor 32 may be vaporized while introducing the precursor 32 into the chamber 10 to maintain the vapor state in the chamber 10.

In example embodiments, a reverse flow-preventing gas may be introduced into the chamber 10 through the fourth diverged gas line 14b of the second gas line 14 while the precursor 32 is introduced into the chamber 10. The reverse flow-preventing gas may prevent the precursor 32 from flowing back to the second gas line 14. The reverse flow-preventing gas may include an inactive gas.

In example embodiments, the electron donating compound 34 may be introduced into chamber 10 with a flow rate of about 15 sccm to about 3,000 sccm for about 0.1 second to about 10 seconds. The electron donating compound 34 of a liquid state may be maintained outside of the chamber 10, e.g. a canister at a temperature of about 20° C. to about 40° C. The electron donating compound 34 may be vaporized while introducing the electron donating compound 34 into the chamber 10 to maintain the vapor state into the chamber 10.

In forming the layer, at least one type of the precursors 32 may be used. In one example embodiment, one type of the precursor 32 may be used for forming the layer. For example, the precursor 32 including zirconium or the precursor 32 including hafnium may be used. In another example embodiment, two types of the precursors 32 may be used for forming the layer. For example, a first precursor including a first metal and a second precursor including a second metal substantially different from the first metal may be used. Here, a solution including the first precursor and the second precursor may be vaporized to be introduced onto the substrate. The first precursor and the second precursor in the solution may have a mole ratio of about 1:4 to about 4:1. For example, in forming the layer, after the solution including the first precursor including zirconium and the second precursor including hafnium is prepared, the solution may be vaporized to simultaneously provide the first precursor including zirconium and the second precursor including hafnium on the substrate 20. Alternately, the first precursor including the first metal and the second precursor substantially different from the first metal are vaporized, respectively, to be simultaneously or sequentially introduced into the chamber 10. In still another embodiment, three types of the precursors may be used for forming the layer. For example, a first precursor including a first metal, a second precursor including a second metal substantially different from the first metal and a third precursor including a third metal substantially different from the first metal and the second metal may be used. When the third precursor is further included in the precursor, the layer formed using the precursor may have improved electrical characteristics. Here, after the solution including the first precursor and the second precursor is vaporized to be introduced onto the substrate 20, the third precursor may be vaporized to be further introduced onto the substrate in a subsequent process. For example, after the solution including the first precursor including zirconium and the second precursor including hafnium is vaporized to be introduced onto the substrate 20, the third precursor including silicon may be vaporized to be further introduced onto the substrate in a subsequent process. When the third precursor including silicon is vaporized to be further introduced onto the substrate, the layer to be formed on the substrate 20 may have improved electrical characteristics.

Figure 5:
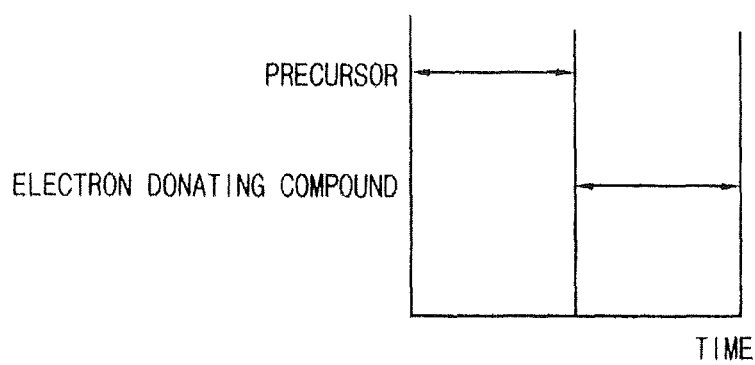

An introduction time of the precursor 32 and the electron donating compound 34 may be varied. Referring to FIGS. 4 and 5, after the precursor 32 is introduced into the chamber 10, the electron donating compound 34 may be introduced into the chamber 10. For example, the precursor 32 may be introduced into the chamber 10 through the first diverged gas line 12a of the first gas line 12 and then the electron donating compound 34 may be introduced into the chamber 10 through the first diverged gas line 12a of the first gas line 12.

Figure 6:
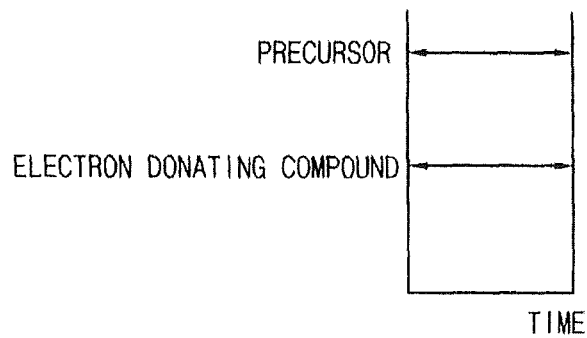

Referring to FIGS. 4 and 6, the precursor 32 and the electron donating compound 34 may be simultaneously introduced into the chamber 10 during a same time interval. For example, the electron donating compound 34 may be introduced into the chamber 10 through the second diverge gas line 12b of the first gas line 12 while the precursor 32 is introduced into the chamber 10 through the first diverged gas line 12a of the first gas line 12.

Figure 7:
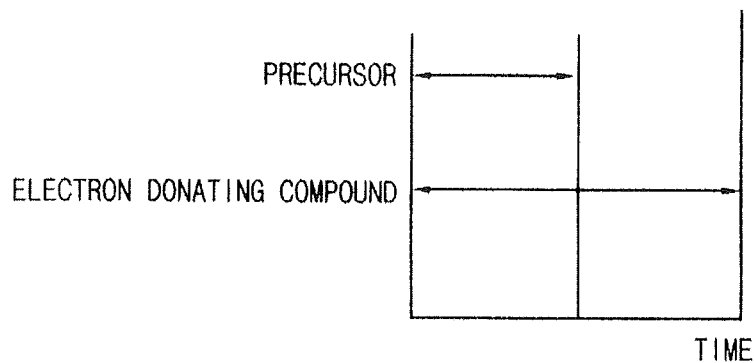

Referring to FIGS. 4 and 7, after the precursor 32 and the electron donating compound 34 are simultaneously introduced into the chamber 10, the electron donating compound 34 may be additionally introduced into the chamber 10 without introducing the precursor 32. For example, after the precursor 32 and the electron donating compound 34 are simultaneously introduced into the chamber 10 through the first diverged gas line 12a and the second diverged gas line 12b of the first gas line 12, respectively, the electron donating compound 34 may be continuously introduced into the chamber 10 for a predetermined time without introducing the precursor 32.

Figure 8A:
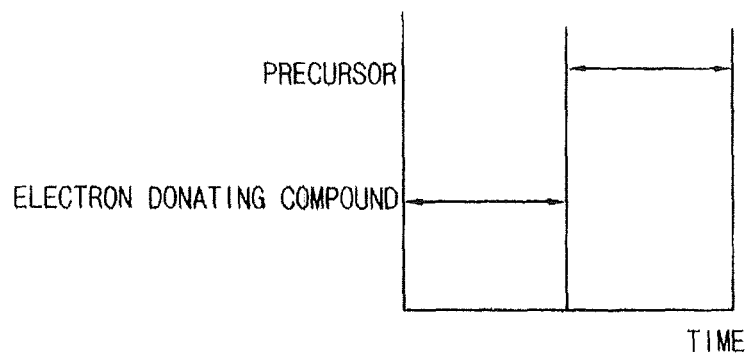

Referring to FIGS. 4 and 8A, after the electron donating compound 34 is introduced into the chamber 10, the precursor 32 may be introduced into the chamber 10. For example, the electron donating compound 34 may be introduced into the chamber 10 through the second diverged gas line 12b of the first gas line 12 and then the precursor 32 may be introduced into the chamber 10 through the first diverged gas line 12a of the first gas line 12.

Figure 8B:
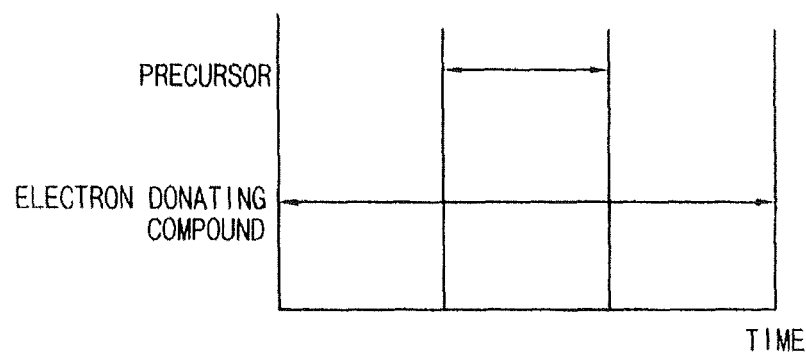

Referring to FIGS. 4 and 8B, after the electron donating compound 34 is introduced into the chamber 10, the precursor 32 and the electron donating compound 34 may be simultaneously introduced into the chamber 10. The electron donating compound 34 may be additionally introduced without introducing the precursor 32. For example, while the electron donating compound 34 is continuously introduced into the chamber 10 through the second diverged gas line 12b of the first gas line 12, the precursor 32 may be introduced for a predetermined time in the middle of the introduction time of the electron donating compound 34 through the first diverged gas line 12a of the first gas line 12.

The electron donating compound 34 may be contacted with the precursor 32 to form the stabilized precursor 30. The metal 32a of the stabilized precursor 30 may be chemisorbed onto the substrate 20. Here, the electron donating compound 34 may be easily detached from the precursor 32 because the binding force between the metal 32a of the precursor 32 and the electron donating compound 34 is weak.

As described above, at least one type of the precursor may be used for forming the layer. When the first precursor including the first metal and the second precursor including the second metal substantially different from the first metal are used for forming the layer, the solution may be vaporized to provide the first precursor and the second precursor onto the substrate 20 after preparing the solution including the first precursor and the second precursor. Alternatively, the first precursor and the second precursor are vaporized, respectively, to be simultaneously or sequentially introduced onto the substrate 20.

In forming the layer, the third precursor including the third metal substantially different from the first metal and the second metal may be further introduced onto the substrate to form the layer. The third precursor may include a material capable of improving electrical characteristics of the layer to be formed. The third precursor may be simultaneously introduced with the first precursor and the second precursor onto the substrate 20. Alternatively, the third precursor may be separately introduced with the first precursor and the second precursor onto the substrate 20. FIGS. 9 to 12 are timing sheets illustrating an introduction time of the first, the second and the third precursors and the electron donating compound when the layer is formed on the substrate using the first, the second and the third precursors and the electron donating compound. For example, the first precursor may include zirconium, the second precursor may include hafnium and the third precursor may include silicon. Referring to FIGS. 9 to 12, after the solution including the first and the second precursors is prepared, the solution may be vaporized to simultaneously provide the first and the second precursors onto the substrate 20.

Figure 9:
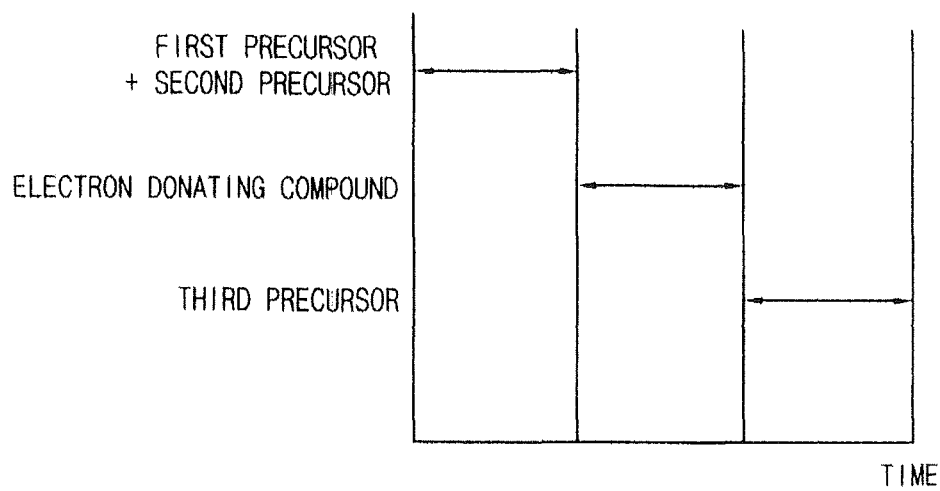
Figure 10:
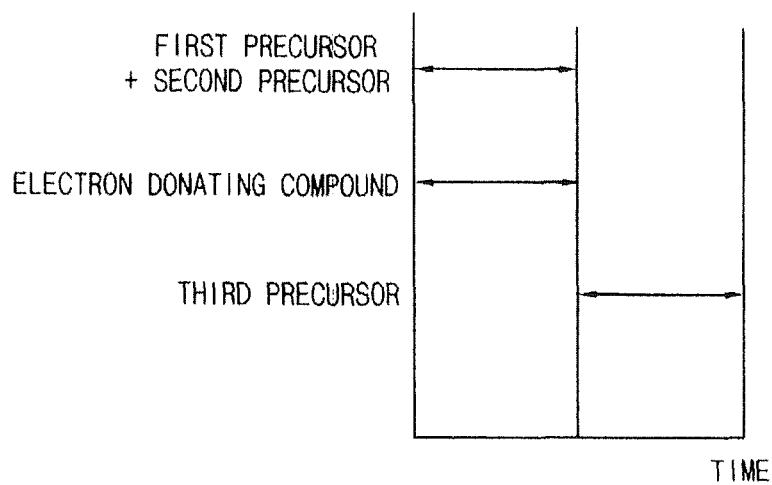
Figure 11:
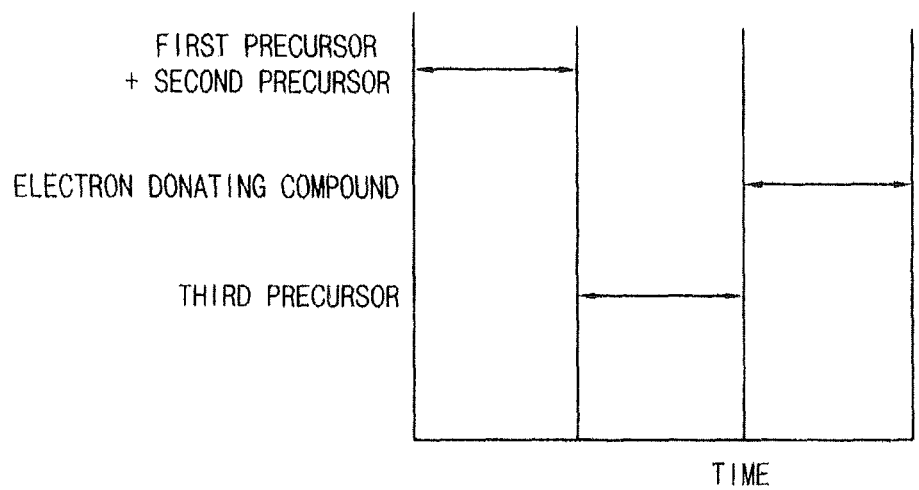
Figure 12:
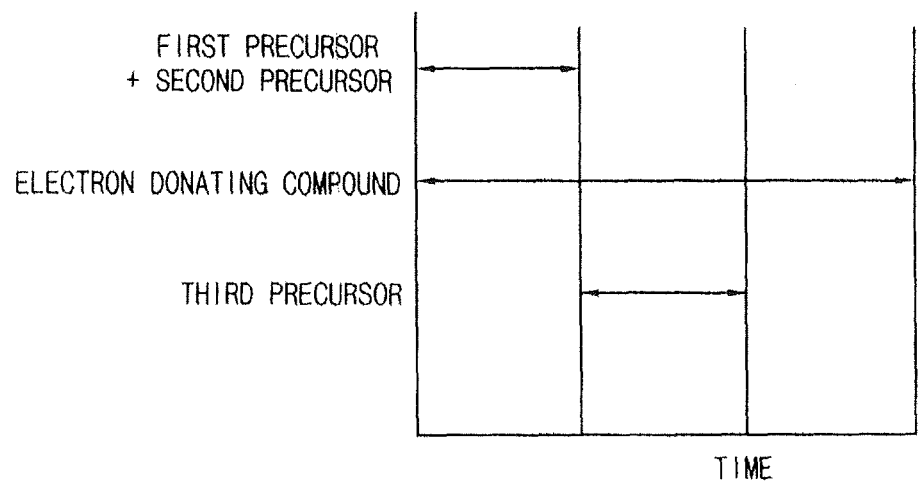

Referring to FIG. 9, after the first and the second precursors are introduced, the electron donating compound and the third precursor may be sequentially introduced onto the substrate 20. Referring to FIG. 10, after the first and the second precursors and the electron donating compound are simultaneously introduced onto the substrate 20, the third precursor may be introduced onto the substrate 20. Referring to FIG. 11, after the first and the second precursors are introduced onto the substrate 20, the third precursor and the electron donating compound may be sequentially introduced onto the substrate 20. Referring to FIG. 12, the first and the second precursors and the electron donating compound are simultaneously introduced onto the substrate 20, the third precursor and the electron donating compound may be simultaneously introduced onto the substrate. After introducing the third precursor and the electron donating compound, the electron donating compound may be further introduced onto the substrate.

It is noted that example embodiments described with reference to FIGS. 9 to 12 are not limited thereto. For example, the first precursor and the second precursor are vaporized, respectively, to be simultaneously introduced onto the substrate 20. Alternatively, the first precursor and the second precursor are vaporized, respectively, to be sequentially introduced onto the substrate 20.

According to example embodiments, a flow rate of the third precursor and an introduction time of the third precursor may be properly adjusted according to the third metal content of the third precursor included in the layer. For example, the third precursor may be introduced into the chamber 10 with a flow rate of about 50 sccm to about 1,000 sccm for about 0.1 second to about 3 seconds.

Figure 13:
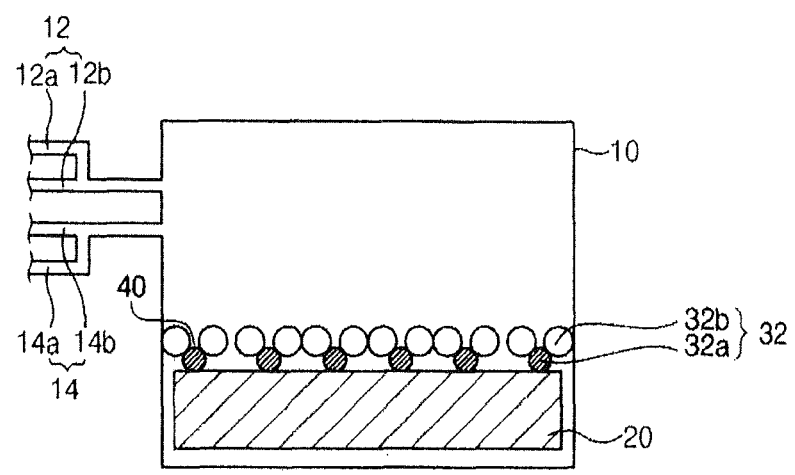

Referring to FIG. 13, the first purge gas may be provided onto the substrate 20 to form a preliminary first layer 40 including the precursor 32 on the substrate 20.

The first purge gas may remove the non-chemisorbed stabilized precursor 30, the non-chemisorbed precursor 32 and a remaining electron donating compound 34 from the substrate 20. The first purge gas may be introduced into the chamber 10 through the first gas line 12. The first purge gas may include an inactive gas such as an argon gas, a helium gas, a nitrogen gas or a neon gas, etc. The purge gas may be introduced into the chamber 10 with a flow rate of about 50 sccm to about 400 sccm for about 0.5 second to about 20 seconds.

In example embodiments, a reverse flow-preventing gas may be introduced into the chamber 10 through the fourth diverged gas line 14b of the second gas line 14 while the first purge gas is introduced into the chamber 10 through the second gas line 12. The reverse flow-preventing gas may prevent the non-chemisorbed stabilized precursor 30, the non-chemisorbed precursor 34 and the remaining electron donating compound 34 from flowing back through the second gas line 14.

In one example embodiment, after the electron donating compound 34 is introduced into the chamber, the purge gas may be introduced onto the substrate 20. In another example embodiment, the purge gas and the electron donating compound 34 may be simultaneously introduced onto the substrate 20.

Figure 14:
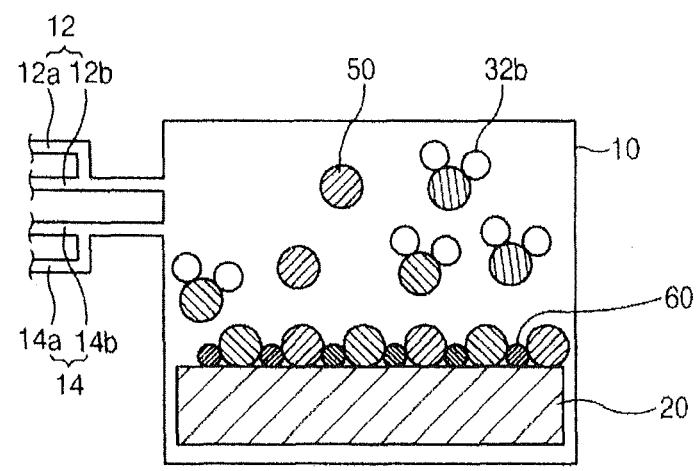

Referring to FIG. 14, the reactant 50 is introduced into the chamber 10. The reactant 50 may be substituted for the ligand 32b of the precursor 32. The reactant 50 may react with the metal 32a of the precursor 32 to form a first layer 60 on the substrate 20.

In example embodiments, the reactant 50 may be introduced into the chamber 10 through the third diverged gas line 14a of the second gas line 14 with a flow rate of about 50 sccm to about 1,000 sccm for about 2 seconds to about 10 seconds.

The reactant 50 may be varied according to reactivity with respect to the metal 32a of the precursor 32 and properties of the layer. In one example embodiment, the reactant 50 may include an oxidant. The oxidant may include ozone, oxygen, an oxygen plasma, water or an ozone plasma. These may be used alone or in a mixture thereof. For example, when the oxidant is ozone which is easily treated, the layer including a metal oxide may have a relatively small amount of impurities. In other example embodiment, the reactant 50 may include a nitrogen atom. For example, the reactant 50 may include ammonia, nitrogen dioxide or nitrous oxide, etc.

In example embodiments, a reverse flow-preventing gas may be introduced into the chamber 10 through the second diverged gas line 12b of the first gas line 12 while the reactant 50 is introduced into the chamber 10 through the third diverged gas line 14a of the second gas line 14. The reverse flow-preventing gas may prevent the reactant 50 from flowing back through the first gas line 12.

Figure 15:
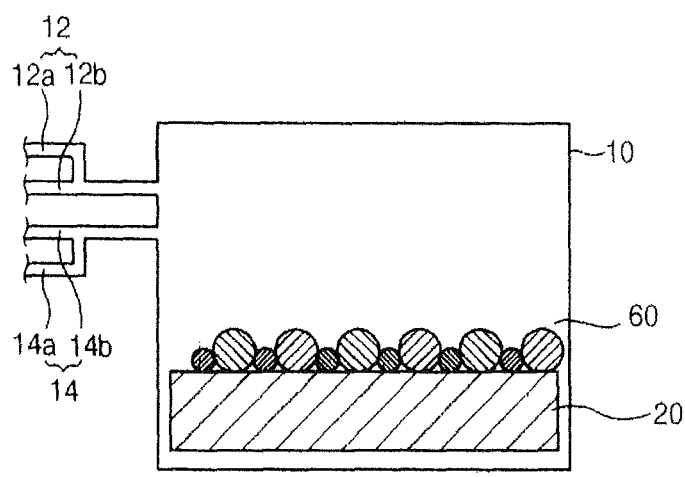

Referring to FIG. 15, a second purge gas may be introduced into the chamber 10 to remove the reactant 50 which does not chemically react with the metal 32a of the precursor 32 and the ligand 32b detached from the metal 32a. The second purge gas may be introduced into the chamber 10 through the fourth diverged gas line 14b of the second gas line 14. The second purge gas may include an inactive gas such as an argon gas, a helium gas, a nitrogen gas or a neon gas, etc. These may be used alone or in a mixture thereof. The second purge gas may be introduced into the chamber 10 with a flow rate of about 50 sccm to about 400 sccm for about 1 second to about 20 seconds.

In example embodiments, a reverse flow-preventing gas may be introduced into the chamber 10 through the second diverged gas line 12b of the first gas line 12 while the second purge gas is introduced into the chamber 10 through the fourth diverged gas line 14b of the second gas line 14. The reverse flow-preventing gas may prevent the reactant 50 which does not chemically react with the metal 32a of the precursor 32 and the ligand 32b detached from the metal 32a from flowing back through the first gas line 12.

The layer having a predetermined thickness may be formed by repeatedly performing an introduction of the precursor 32 and the electron donating compound 34, an introduction of the first purge gas, an introduction of the reactant 50 and an introduction of the second purge gas. The layer may include various materials according to the precursor 32 and the reactant 50. For example, when the reactant 50 is an oxidant, the layer may be a metal oxide. When the reactant 50 includes the nitrogen atom, the layer may include a metal nitride.

According to example embodiments, when the precursor 32 of the vapor state is contacted with the electron donating compound 34 of the vapor state, a thermal stability of the precursor 32 may be improved. Accordingly, a dissociation of the precursor 32 may be prevented before the precursor 32 is chemisorbed on the substrate 20. As a result, precipitates caused by a decomposition of the precursor 32 may be prevented from being reacted with the precursor 32 chemisorbed on the substrate 20. Further, the precipitates caused by a dissociation of the precursor 32 may be prevented from being chemisorbed on the upper portion of the hole, the trench, the gap or the recess and thus the precursor 32 may be uniformly diffused into the lower portion of the hole, the trench, the gap or the recess. Hence, the layer having a good step coverage may be formed on the stepped portion of the substrate 20.

Hereinafter, a method of forming a gate structure will be explained in detail with reference to the accompanying drawings.

Figure 16:
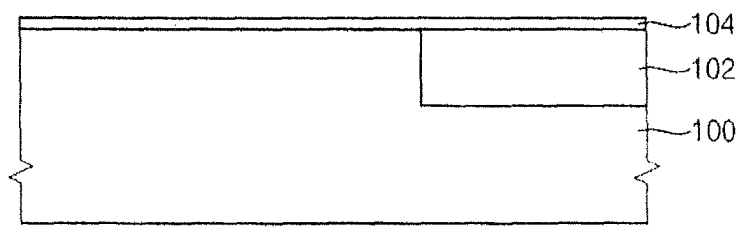
Figure 17:
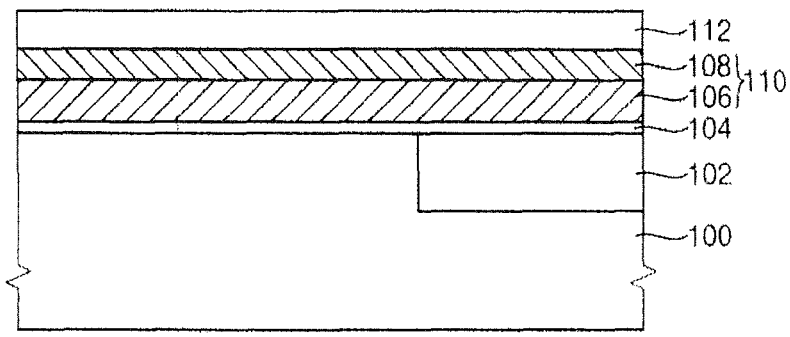
Figure 18:
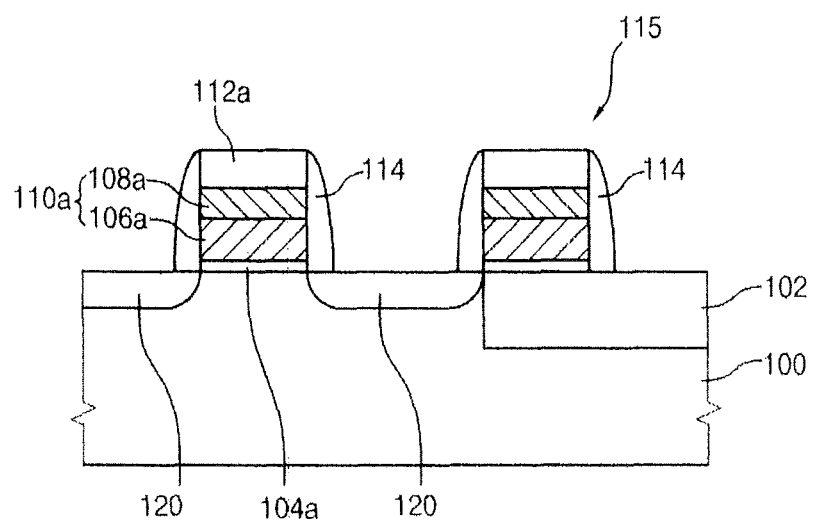

FIGS. 16 to 18 are cross-sectional views illustrating a method of forming a gate structure in accordance with example embodiments.

Referring to FIG. 16, an isolation layer 102 is formed on a substrate 100 including a cell region and a peripheral region to define an active region and a field region.

The isolation layer 102 may be formed on the substrate 100 by a shallow trench isolation (STI) process or a thermal oxidation process. The isolation layer 102 may include silicon oxide. The substrate 100 may include a semiconductor substrate such as silicon substrate, a germanium substrate, a silicon-germanium substrate, a silicon-on-insulator (SOI) substrate, a germanium-on-insulator (GOI) substrate, etc. Alternatively, the substrate 100 may include a single crystalline metal oxide substrate. For example, the substrate 100 may include a single crystalline aluminum oxide ($Al_2O_3$) substrate, a single crystalline strontium titanium oxide ($SrTiO_3$) substrate or a single crystalline magnesium oxide (MgO) substrate.

The gate insulation layer 104 is formed on the substrate 100. The gate insulation layer 104 may have a thin equivalent oxidation thickness (EOT) and sufficiently reduce a leakage current. In example embodiments, the gate insulation layer 104 having a uniform thickness may be formed using a precursor stabilized by an electron donating compound.

When the precursor used for forming the gate insulation layer 104 is unstable to a heat, the precursor may be easily dissociated at a high temperature atmosphere that is required for a CVD process or an ALD process. In example embodiments, when the precursor is contacted with the electron donating compound, the precursor may have improved thermal stability and thus the precursor may not easily disassociate at a high temperature atmosphere. The electron donating compound may donate an electron to a metal of the precursor to stabilize the precursor because a weak intermolecular interaction is formed between the precursor and the electron donating compound.

In formation of the gate insulation layer 104, the precursor stabilized by the electron donating compound may be provided onto the substrate 100. In one example embodiment, the precursor of a liquid state may be contacted with the electron donating compound of a liquid state to form the stabilized precursor. For example, the precursor of the liquid state may be mixed with the electron donating compound of the liquid state to form a precursor composition including the stabilized precursor. Here, the precursor composition may be vaporized to provide the stabilized precursor onto the substrate 100. In other example embodiment, the precursor of a vapor state may be contacted with the electron donating compound of a vapor state to form the stabilized precursor. For example, the precursor and the electron donating compound may be vaporized to be introduced onto the substrate 100, respectively. Thus, the precursor of the vapor state may be contacted with the electron donating compound of the vapor state on the substrate 100 to provide the stabilized precursor onto the substrate 100.

A reactant binding to the metal of the precursor is provided on the substrate 100 to form the gate insulation layer 104. The reactant may be substituted for a ligand of the precursor. The gate insulation layer 104 may be formed by a CVD process or an ALD process.

In one example embodiments, when the reactant includes an oxidant including an oxygen atom, the gate insulation layer 104 including a metal oxide may be formed on the substrate 100. For example, when the metal of the precursor includes zirconium and the reactant includes ozone, the gate oxide layer 104 including zirconium oxide may be formed on the substrate 100. Alternatively, when the precursor includes a first precursor including hafnium and a second precursor including zirconium and the reactant includes ozone, the gate oxide layer 104 including hafnium-zirconium oxide may be formed on the substrate 100. Alternatively, when the precursor includes a first precursor including hafnium, a second precursor including zirconium and a third precursor including silicon and the reactant includes ozone, the gate oxide layer 104 including hafnium-zirconium silicate may be formed on the substrate 100.

Referring to FIG. 17, a gate conductive layer 110 is formed on the gate insulation layer 104. The gate conductive layer 110 may include a polysilicon layer 106 on the gate insulation layer 104 and a metal silicide layer 108 on the polysilicon layer 106. Here, the metal silicide layer 108 may include tungsten silicide, titanium silicide, tantalum silicide or cobalt silicide. A capping layer 112 may be formed on the gate conductive layer 110.

Referring to FIG. 18, the capping layer 112, the gate conductive layer 110 and the gate insulation layer 104 are patterned to form a gate structure 115 on the substrate 100. The gate structure 115 may include the gate insulation layer pattern 104a, a gate conductive layer pattern 110a including a polysilicon layer pattern 106a and a metal silicide layer pattern 108a and a capping layer pattern 112a. The gate structure 115 may be formed by a photolithography process.

A nitride layer is formed on the substrate 100 to cover the gate structure 115. An anisotropic etching process is performed at the nitride layer to form a gate spacer 114 on a sidewall of the gate structure 115. For example, the gate spacer 114 may be formed using silicon nitride.

Impurities are implanted into the substrate 100 adjacent to the gate structure 115 to form source/drain regions 120. For example, the source/drain regions 120 may be formed by an ion-implantation process using the gate structure 115 and the gate spacer 114 as an implantation mask.

According to example embodiments, the precursor is contacted with the electron donating compound to improve the thermal stability of the precursor. Therefore, the stabilized precursor may not be dissociated at a high temperature atmosphere to maintain the vapor state in the chamber in which the gate insulation layer is formed. As a result, precipitates caused by a dissociation of the precursor may not be generated and the precursor may be uniformly diffused onto the substrate to form a layer having a uniform thickness.

Hereinafter, a method of forming a capacitor will be explained in detail with reference to the accompanying drawings.

FIGS. 19 to 22 are cross-sectional views illustrating a method of manufacturing a capacitor in accordance with example embodiments.

Figure 19:
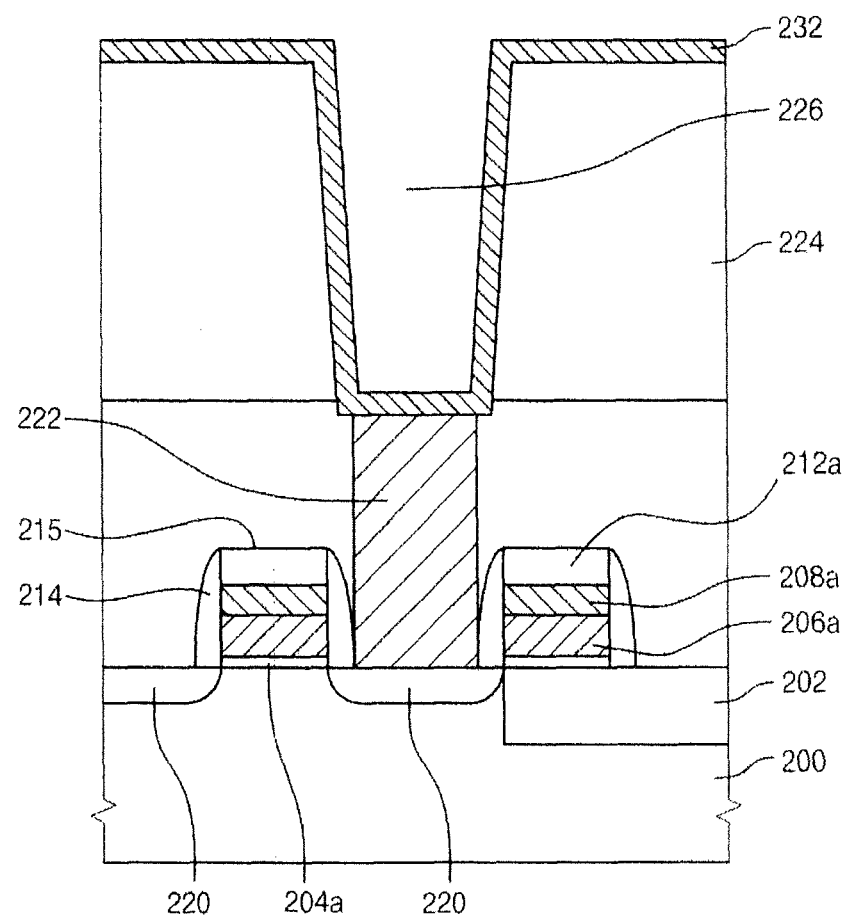

Referring to FIG. 19, a substrate 200 on which a conductive structure is formed is provided. The conductive structure may include an isolation layer 202, source/drain regions 220, a gate structure 215 including a gate insulation layer pattern 204a, a polysilicon layer pattern 206a, a metal silicide layer pattern 208a and a capping layer pattern 212a and a gate spacer 214 and a contact plug 222.

An insulating interlayer is formed on the substrate 200 to cover the contact plug 222. The insulating interlayer is partially removed until the contact plug 222 is exposed to form an insulating interlayer pattern 224 including a contact hole 226. The insulting interlayer pattern 224 may be formed using an oxide, a nitride or an oxynitride. For example, the insulating interlayer pattern 224 may include silicon oxide such as phosphorous silicate glass (PSG), borophosphosilicate glass (BPSG), undoped silicate glass (USG), spin-on glass (SOG), flowable oxide (FOx), tetraethyl orthosilicate (TEOS), plasma-enhanced tetraethyl orthosilicate (PE-TEOS), high-density plasma chemical vapor deposition (HDP-CVD) oxide, etc.

A first conductive layer 232 is formed on the contact hole 226 and the insulating interlayer pattern 224. The first conductive layer 232 may be formed using titanium, titanium nitride, tantalum, tantalum nitride, polysilicon, tungsten, tungsten nitride or ruthenium.

Figure 20:
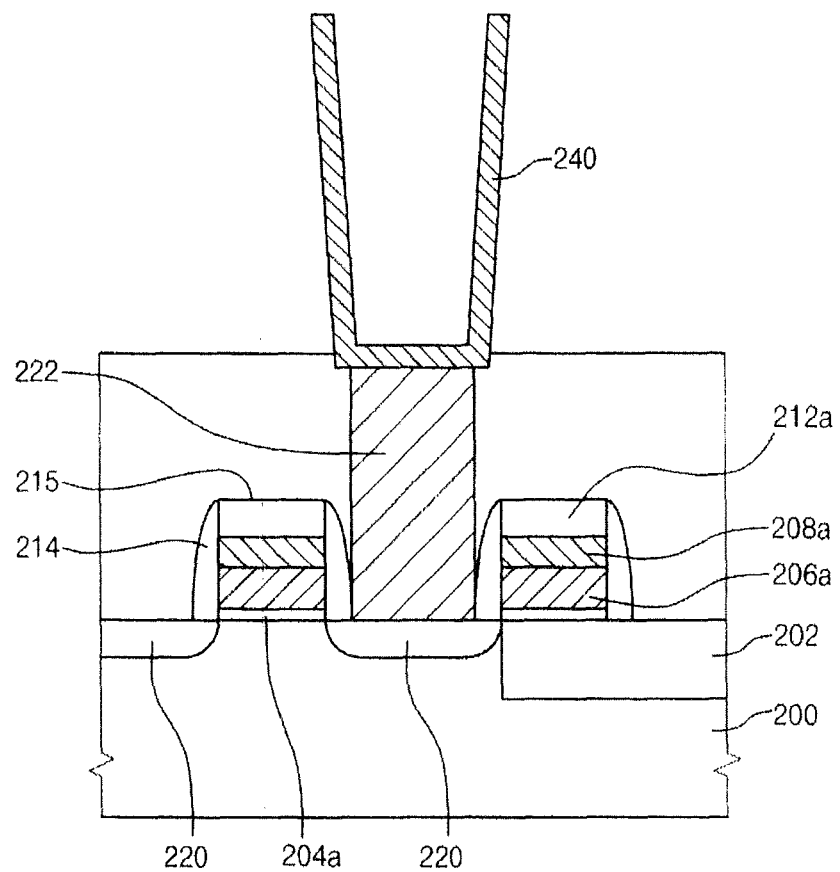

Referring to FIG. 20, a lower electrode 240 is formed on contact plug 222. The lower electrode 240 may be electrically connected to the contact plug 222.

In formation of the lower electrode 240, a sacrificial layer (not illustrated) is formed on the first conductive layer 232. The sacrificial layer and the first conductive layer 232 are partially removed until the insulation interlayer pattern 224 is exposed. The sacrificial layer may be formed using an oxide such as silicon oxide. The sacrificial layer remaining in the contact hole 226 and the insulating interlayer pattern 224 is removed to form the lower electrode 240.

Figure 21:
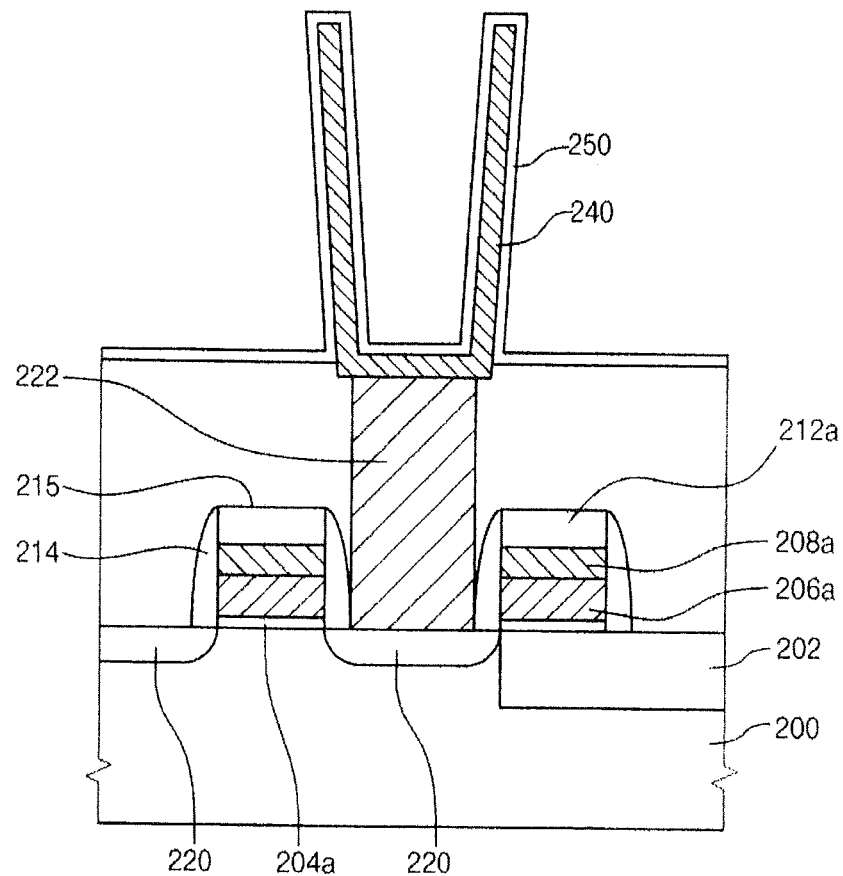

Referring to FIG. 21, a dielectric layer 250 is formed on the lower electrode 240. The dielectric layer 250 may have a thin EOT, a high dielectric constant and a uniform thickness from a surface of the lower electrode 240. In example embodiments, the dielectric layer 250 may be formed using a precursor contacted with an electron donating compound. The precursor contacted with an electron donating compound may have improved thermal stability. When the precursor is contacted with the electron donating compound, the electron donating compound may donate an electron to a metal of the precursor to stabilize the precursor because an intermolecular interaction is formed between the precursor and the electron donating compound. When the precursor used for forming the dielectric layer 250 is unstable to heat, the ligand of the precursor may be easily detached from the metal of the precursor and thus the thickness of the dielectric layer 250 may not be efficiently controlled. Additionally, precipitates caused by dissociation of the precursor may be deposited on an upper portion of the lower electrode 240 to prevent the precursor from being uniformly diffused into a lower portion of the lower electrode 240. According to example embodiments, when the thermal stability of the precursor is improved, the thickness of the dielectric layer 250 may be efficiently adjusted and the precursor may be uniformly diffused into the lower portion of the lower electrode 240 without a dissociation of the precursor. Accordingly, the dielectric layer 250 formed using the stabilized precursor may have a good step coverage.

In formation of the dielectric layer 250, the precursor stabilized by the electron donating compound is provided on the lower electrode 240.

In one example embodiment, the precursor of the liquid state may be contacted with the electron donating compound of the liquid state. For example, the precursor of the liquid state may be mixed with the electron donating compound of the liquid state to form a precursor composition. Here, the precursor composition may be vaporized to provide the stabilized precursor on the substrate 200 on which the lower electrode 240 is formed. In other example embodiment, the precursor of the vapor state may be contacted with the electron donating compound of the vapor state. For example, the precursor and the electron donating compound may be vaporized to be provided on the lower electrode 240, respectively. The vaporized precursor may be contacted with the electron donating compound to provide the stabilized precursor on the substrate 200 on which the lower electrode 240 is formed.

The stabilized precursor is reacted with a reactant to form the dielectric layer 250 on the lower electrode 240. The reactant may be substituted for the ligand of the precursor. The dielectric layer 250 may be formed by a CVD process or an ALD process.

In example embodiments, when the reactant is an oxidant including an oxygen atom, the dielectric layer 250 may include a metal oxide. For example, when the metal of the precursor is zirconium and the reactant includes ozone, the dielectric layer 250 including zirconium oxide may be uniformly formed on the lower electrode 240. For example, when the precursor includes a first precursor including zirconium and a second precursor including hafnium and the reactant includes ozone, the dielectric layer 250 including hafnium-zirconium oxide may be uniformly formed on the lower electrode 240. For example, when the precursor includes a first precursor including zirconium, a second precursor including hafnium and a third precursor including silicon and the reactant includes ozone, the dielectric layer 250 including hafnium-zirconium silicate may be uniformly formed on the lower electrode 240.

Figure 22:
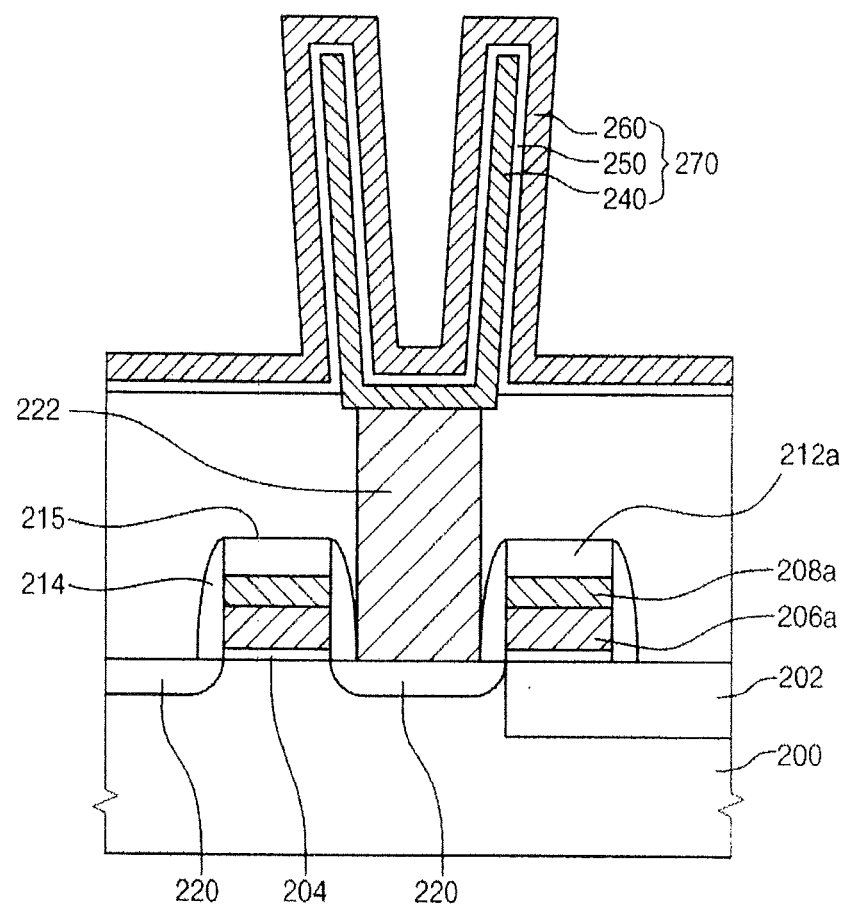

Referring to FIG. 22, an upper electrode 260 is formed on the dielectric layer 250 to form a capacitor 270 including the lower electrode 240, the dielectric layer 250 and the upper electrode 260. The upper electrode 260 may be formed using titanium, titanium nitride, tantalum, tantalum nitride, polysilicon, tungsten, tungsten nitride or ruthenium.

According to example embodiments, the capacitor 270 may be formed using the precursor stabilized by the electron donating compound. The stabilized precursor may have an improved thermal stability. As a result, the precursor may not be dissociated at a high temperature atmosphere so that the precursor may be uniformly diffused into the lower portion of the lower electrode to form the dielectric layer having a good step coverage. Thus, the leakage currents may be efficiently reduced between the upper electrode 260 and the lower electrode 240.

Hereinafter, characteristics of the precursor and the layer formed using the precursor will be evaluated.

Evaluation of a Thermal Stability of a Precursor

Experiment 1

Tetrakis(ethylmethylamido)zirconium (TEMAZ, $Zr(NHCH_3C_2H_5)_4$) of a liquid state was mixed with ethyl methyl amine (EMA, $NHCH_3C_2H_5$) of a liquid state at a room temperature to form a precursor composition. The precursor composition was heated to a temperature of about 130° C. to measure a Gardner index of the precursor composition using a colorimeter OME 2000, manufactured by Nippon Denshoku Instrument in Japan. As the Gardner index is higher, a color of the precursor composition is deeper so that generation of precipitates is larger in the precursor composition.

A precursor composition 1 and a precursor composition 2 were prepared. The precursor composition 1 and the precursor composition 2 were prepared by mixing tetrakis(ethylmethylamido)zirconium and ethyl methyl amine with a mole ratio of about 1:1 and about 1:2, respectively. A comparative composition 1 including only tetrakis(ethylmethylamido)zirconium was prepared. The precursor composition 1, the precursor composition 2 and the comparative composition 1 were heated to a temperature of about 130° C. Then, the Gardner index of the precursor compositions 1 and 2 and the comparative composition 1 were measured with the colorimeter OME 2000 while the precursor compositions 1 and 2 and the comparative composition 1 were maintained at a temperature of about 130° C. for about 24 hours. Results are illustrated in Table 1.

TABLE 1

| Temperature/time | Precursor composition 1 | Precursor composition 2 | Comparative composition 1 |
|---|---|---|---|
| Room temperature | 0.2 | 0.2 | 0.2 |
| 130° C./6 hours | 2.0 | 2.0 | 5.3 |
| 130° C./12 hours | 5.3 | 5.0 | 7.0 |
| 130° C./24 hours | 7.2 | 6.8 | 19.0 |

Referring to Table 1, the precursor compositions 1 and 2 and the comparative composition 1 were a substantially transparent liquid state at a room temperature. After about 6 hours at a temperature of about 130° C., the Gardner index of the precursor compositions 1 and 2 was not rapidly increased. However, the Gardner index of the comparative composition 1 was rapidly increased. Thus, it was confirmed that precipitates caused by dissociation of tetrakis(ethylmethylamido)zirconium were generated in the comparative composition 1 after about 6 hours at a temperature of about 130° C. Further, after about 12 hours at a temperature of about 130° C., the Gardner index of the precursor compositions 1 and 2 was substantially less than the Gardner index of the comparative composition 1. Accordingly, it is confirmed that tetrakis(ethylmethylamido)zirconium of the liquid state contacted with ethyl methyl amine may not be dissociated for a long time at a high temperature atmosphere.

Experiment 2

A thermal stability of the stabilized precursor in the precursor composition according to a mole ratio of the precursor of a liquid state and the electron donating compound of a liquid state was evaluated.

Precursor compositions 3 to 11 were prepared by mixing tetrakis(ethylmethylamido)zirconium (TEMAZ) and ethyl methyl amine (EMA) with a mole ratio of about 1:0.02, about 1:0.05, about 1:0.1, about 1:0.2, about 1:0.3, about 1:0.5, about 1:0.7, about 1:3 and about 1:4, respectively. After the precursor compositions 1 to 11 and the comparative composition 1 were heated to a temperature of about 160° C. and were kept for about 1 hour, a Gardner index of the precursor compositions 1 to 11 and the comparative composition 1 was measured using the colorimeter OME 2000, manufactured by Nippon Denshoku Instrument in Japan. Results are illustrated in Table 2.

TABLE 2

| | Gardner index |
|---|---|
| Comparative composition 1 | 18.2 |
| Precursor composition 1 | 6.6 |
| Precursor composition 2 | 5.3 |
| Precursor composition 3 | 12.1 |
| Precursor composition 4 | 11.3 |
| Precursor composition 5 | 10.6 |
| Precursor composition 6 | 10.2 |

TABLE 2-continued

| | Gardner index |
|---|---|
| Precursor composition 7 | 10.0 |
| Precursor composition 8 | 9.8 |
| Precursor composition 9 | 8.2 |
| Precursor composition 10 | 4.0 |
| Precursor composition 11 | 3.6 |

Referring to Table 2, the comparative composition 1 had a highest Gardner index and thus it was confirmed that plenty of tetrakis(ethylmethylamido)zirconium was dissociated. The precursor compositions 1 to 11 had a substantially lower Gardner index than the comparative composition 1. Accordingly, it was confirmed that tetrakis(ethylmethylamido)zirconium was less dissociated in the precursor compositions 1 to 11 than in the comparative composition 1. Further, the precursor compositions 1, 2, 10 and 11 had a much lower Gardner index than that of the comparative composition 1. Thus, it is confirmed that when the mole ratio of the electron donating compound with respect to the precursor was more than about 1, a dissociation of the precursor may be efficiently prevented.

Experiment 3

Precursor compositions were prepared by mixing tetrakis(ethylmethylamido)hafnium (TEMAH) of a liquid state and ethyl methyl amine (EMA) of a liquid state. After the precursor compositions were heated to temperatures of about 140° C., about 160° C., about 180° C., about 200° C. and about 220° C., respectively, and were kept for about 1 hour, a Gardner index of the precursor compositions was measured using the colorimeter OME 2000, manufactured by Nippon Denshoku Instrument in Japan.

A precursor composition 12 was prepared by mixing by mixing tetrakis(ethylmethylamido)hafnium (TEMAH) and ethyl methyl amine (EMA) with a mole ratio of about 1:1 at a room temperature. A comparative composition 2 including only tetrakis(ethylmethylamido)hafnium (TEMAH) was prepared. The precursor compositions 12 and the comparative compositions 2 were heated to temperatures of about 140° C., about 160° C., about 180° C., about 200° C. and about 220° C., respectively, and were kept for about 1 hour, a Gardner index of the precursor compositions 12 and comparative compositions 2 were measured using the colorimeter OME 2000, manufactured by Nippon Denshoku Instrument in Japan. Results are illustrated in Table 3.

TABLE 3

| Temperature/time | Comparative composition 2 | Precursor composition 12 |
|---|---|---|
| Room temperature | 0.0 | 0.2 |
| 140° C./1 hour | 0.3 | 0.2 |
| 160° C./1 hour | 2.6 | 0.2 |
| 180° C./1 hour | 8.4 | 1.4 |
| 200° C./1 hour | 17.6 | 11.0 |
| 220° C./1 hour | 19.0 | 18.4 |

Referring to Table 3, the precursor composition 12 and the comparative composition 2 were a substantially transparent liquid state at a room temperature. Although the precursor composition 12 was heated up to a temperature of about 180° C. and was kept for about 1 hour, the Gardner index of the precursor composition 12 was not rapidly increased. Thus, it was confirmed that tetrakis(ethylmethylamido)hafnium (TEMAH) was not dissociated when the composition 12 was heated up to a temperature of about 180° C. and was kept for about 1 hour. However, the Gardner index of the comparative composition 2 was higher than that of the precursor composition 12 at each temperature. Further, the Gardner index of the comparative composition 2 was rapidly increased when the comparative composition 2 was heated to a temperature of higher than about 160° C. Thus, it is confirmed that tetrakis (ethylmethylamido)hafnium (TEMAH) of the comparative composition 2 may be easily dissociated as a temperature of the comparative composition 2 is increased. Accordingly, it is confirmed that tetrakis(ethylmethylamido)hafnium of the liquid state contacted with ethyl methyl amine may not be dissociated for a long time at a high temperature atmosphere.

Experiment 4

A precursor composition was prepared by mixing tetrakis (ethylmethylamido)hafnium (TEMAH) of a liquid state, tetrakis(ethylmethylamido)zirconium (TEMAZ) of a liquid state and ethyl methyl amine (EMA) of a liquid state. The precursor compositions were heated to a temperature of about 130° C. and were kept for about 3 hours, about 6 hours, about 24 hours or 48 hours, a Gardner index of the precursor compositions was measured using the colorimeter OME 2000, manufactured by Nippon Denshoku Instrument in Japan.

A precursor composition 13 was prepared by mixing by mixing tetrakis(ethylmethylamido)hafnium (TEMAH), tetrakis(ethylmethylamido)zirconium (TEMAZ) and ethyl methyl amine (EMA) with a mole ratio of about 1:2:3 at a room temperature. A comparative composition 3 including tetrakis(ethylmethylamido)hafnium (TEMAH) and tetrakis (ethylmethylamido)zirconium (TEMAZ) with a mole ratio of about 1:2 was prepared. The precursor composition 13 and the comparative composition 3 were heated to a temperature of about 130° C. and were kept for about 3 hours, about 6 hours, about 24 hours or 48 hours, a Gardner index of the precursor composition 13 was measured. Results are illustrated in Table 4.

TABLE 4

| Temperature/time | Precursor composition 12 | Comparative composition 3 |
| --- | --- | --- |
| 130° C./3 hours | 0.3 | 9.0 |
| 130° C./6 hours | 0.5 | 13.2 |
| 130° C./12 hours | 5.7 | 16.4 |
| 130° C./24 hours | 9.7 | 18.1 |
| 130° C.48 hours | 14.4 | 19.0 |

Referring to Table 4, after about 12 hours at a temperature of about 130° C., the Gardner index of the precursor composition 13 was not rapidly increased. However, after about 3 hours at a temperature of about 130° C., the Gardner index of the comparative composition 1 was rapidly increased. Thus, it was confirmed that precipitates caused by dissociation of precursors such as tetrakis(ethylmethylamido)zirconium or tetrakis(ethylmethylamido)hafnium were generated in the comparative composition 3 not including ethyl methyl amine (EMA). Accordingly, it is confirmed that tetrakis(ethylmethylamido)hafnium and tetrakis(ethylmethylamido)zirconium contacted with an electron donating compound such as ethyl methyl amine may not be dissociated for a long time at a high temperature atmosphere.

Experiment 5

A precursor composition was prepared by mixing tetrakis (ethylmethyl amido)zirconium (TEMAZ) of a liquid state and ethyl methyl amine (EMA) of a liquid state. The precursor composition was heated to a predetermined temperature and then was kept for a predetermined time. Then, a thermal gravimetric analysis (TGA) was performed to measure a ratio of solid residues weight with respect to a weight of the precursor composition.

A precursor composition 14 and a precursor composition 15 were prepared by mixing tetrakis(ethylmethylamido)zirconium of a liquid state and ethyl methyl amine of a liquid state with a mole ratio of about 1:0.9 and about 1:12, respectively. A comparative composition 1 prepared in Experiments 1 and 2, precursor compositions 2 to 5, 7, 8, 10 and 11 prepared in Experiments 1 and 2, and the precursor compositions 14 and 15 were heated to a temperature of about 160° C., and were kept for about 1 hour. Then, TGA was performed. Results are illustrated in Table 5. A ratio in Table 5 is represented as in percentage (%). In performing TGA, the comparative composition 1 prepared in Experiments 1 and 2, the precursor compositions 2 to 5, 7, 8, 10 and 11 prepared in Experiments 1 and 2, and the precursor compositions 14 and 15 were heated from a temperature of about 30° C. to about 200° C. with a ratio of about 10° C./min. The comparative composition 1 prepared in Experiments 1 and 2, the precursor compositions 2 to 5, 7, 8, 10 and 11 prepared in Experiments 1 and 2, and the precursor compositions 14 and 15 were heated to a temperature of about 180° C., and were kept for about 1 hour. Then, TGA was performed. Results are illustrated in Table 5. As the percentage (%) is increased, a dissociation of tetrakis(ethylmethylamido)zirconium is increased. That is, when the percentage (%) is increased, the precursor composition is unstable to heat.

TABLE 5

|  | 160° C./1 hour | 180° C./1 hour |
| --- | --- | --- |
| Comparative composition 1 | 1.6% | 6.5% |
| Precursor composition 2 | 0.9% | 3.9% |
| Precursor composition 3 | 0.8% | 5.3% |
| Precursor composition 4 | 0.8% | 4.2% |
| Precursor composition 5 | 0.6% | 4.0% |
| Precursor composition 7 | 0.9% | 3.8% |
| Precursor composition 8 | 0.8% | 4.2% |
| Precursor composition 10 | 1.4% | 3.8% |
| Precursor composition 11 | 1.3% | 3.8% |
| Precursor composition 14 | 1.1% | 4.2% |
| Precursor composition 15 | 1.5% | 4.5% |

Referring to Table 5, the solid residues weight with respect to the weight of the precursor compositions 2 to 5, 7, 8, 10, 11, 14 and 15 including tetrakis(ethylmethylamido)zirconium and ethyl methyl amine was less than that of the comparative composition 1 at a temperature of about 160° C. to about 180° C. Accordingly, it is confirmed that tetrakis(ethylmethylami- do)zirconium contacted with ethyl methyl amine may have an improved thermal stability.

Experiment 6

Figure 23:
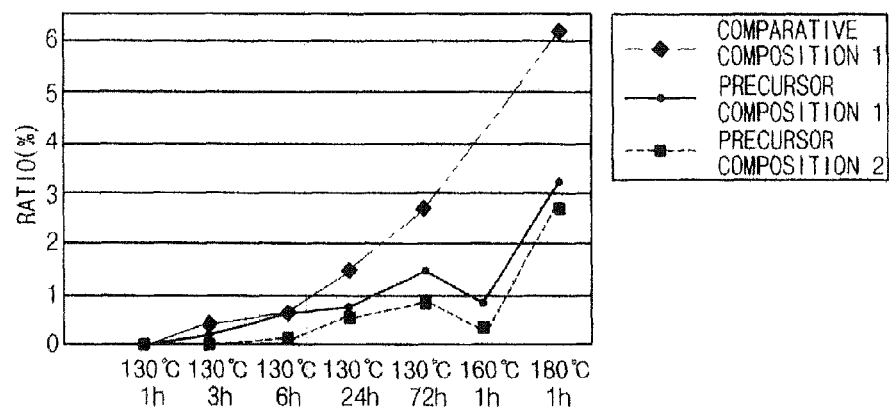

The precursor compositions 1 and 2 and the comparative composition 1 were heated to about 130° C., and were kept for about 3 hours, about 6 hours, about 24 hours or 72 hours. Further, the precursor compositions 1 and 2 and the comparative composition 1 were heated to a temperature of about 160° C. to about 180° C. and were kept for about 1 hour. Then, TGA was performed to measure a ratio of solid residues weight with respect to a weight of the precursor compositions 1 and 2 and the comparative composition 1. Results are illustrated in FIG. 23. A ratio in FIG. 23 is represented as in percentage (%). The TGA was performed by a method substantially the same as or substantially similar to the above described method in Experiment 5.

Referring to FIG. 23, when the comparative composition 1 not including ethyl methyl amine was heated to a temperature of about 130° C., and was kept for more than about 6 hours, a large amount of the solid residues was generated in the comparative composition 1. Further, the solid residues weight in the comparative composition 1 kept for about 1 hour at a temperature of about 160° C. to about 180° C. was about two times more than those in the precursor compositions 1 and 2.

Referring again to FIG. 23, the solid residues weight with respect to the weight of the precursor compositions 1 and 2 was not rapidly increased in the precursor compositions 1 and 2 which were kept for about 6 hours at a temperature of about 130° C. Additionally, the solid residues weight with respect to the weight of the precursor compositions 1 and 2 was less than that of the comparative composition 1 kept for about hour at a temperature of about 160° C. to about 180° C. Additionally, the solid residues weight with respect to the weight of the precursor composition 2 was relatively less than the solid residues weight with respect to the weight of the precursor composition 1.

Experiment 7

Figure 24:
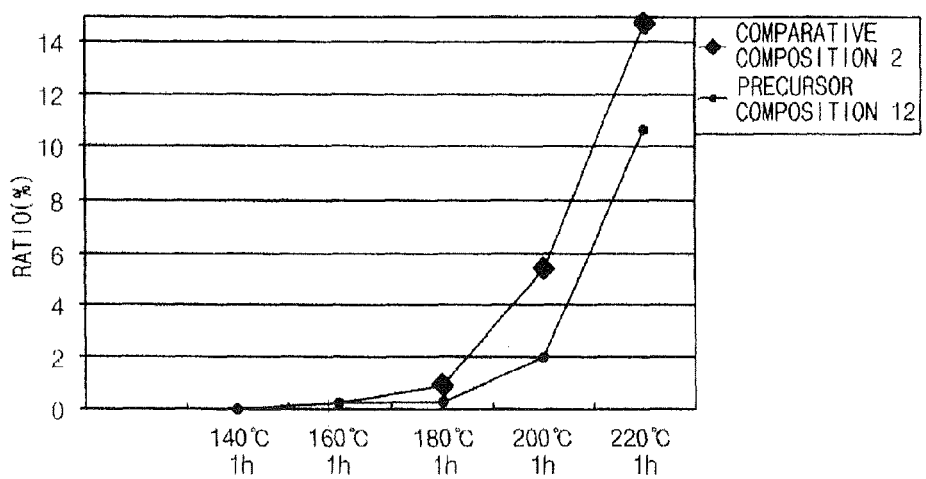

The precursor compositions 12 the comparative compositions 2 were heated to temperatures of about 140° C., 160° C., 180° C., 200° C. and 220° C., respectively, and were kept for about 1 hour. Then, TGA was performed to measure a ratio of solid residues weight with respect to a weight of the precursor composition 12 and the comparative composition 2. Results are illustrated in FIG. 24. A ratio in FIG. 24 is represented as in percentage (%). The TGA was performed by a method substantially the same as or substantially similar to the above described method in Experiment 5.

Referring to FIG. 24, the comparative composition 1 including tetrakis(ethylmethylamido)hafnium (TEMAH) was heated to a temperature of about 200° C. to about 220° C. and was kept for 1 hour, the TGA was performed. The solid residues weight in the comparative composition 2 kept for about 1 hour at a temperature of about 200° C. was about three times more than those in the precursor composition 12. The solid residues weight in the comparative composition 2 kept for about 1 hour at a temperature of about 220° C. was about 1.5 times more than those in the precursor composition 12. Accordingly, it is confirmed that tetrakis(ethylmethylamido)hafnium contacted with ethyl methyl amine may have an improved thermal stability may not easily disassociate at a high temperature atmosphere.

Experiment 8

Figure 25:
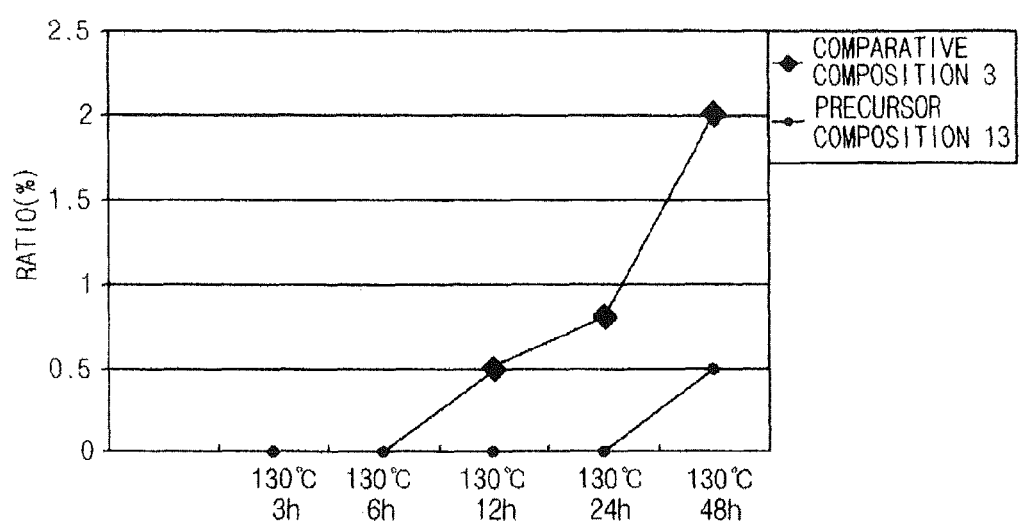

The precursor composition 13 and the comparative composition 3 were heated to a temperature of about 130° C., and were kept for about 3 hours, about 6 hours, about 24 hours or 48 hours. Then, TGA was performed to measure a ratio of solid residues weight with respect to a weight of the precursor composition 13 and the comparative composition 3. Results are illustrated in FIG. 25. A ratio in FIG. 25 is represented as in percentage (%). The TGA was performed by a method substantially the same as or substantially similar to the above described method in Experiment 5.

Referring to FIG. 25, the solid residues were not generated in the precursor composition 13. However, when the comparative composition 3 including only tetrakis(ethylmethylamido)hafnium (TEMAH) and tetrakis-ethylmethyl amidozirconium (TEMAZ) was heated to a temperature of about 130° C., was kept for more than about 6 hours and the TGA was performed, a large amount of the solid residues was generated in the comparative composition 3. Accordingly, it is confirmed that the precursor composition may be efficiently stabilized by an electron donating compound such as ethyl methyl amine (EMA) when the precursor composition includes two precursors.

Experiment 9

Figure 26:
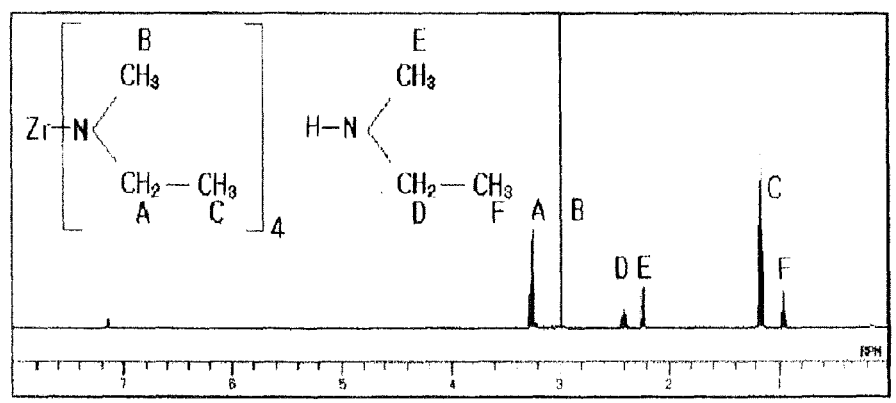
Figure 27:
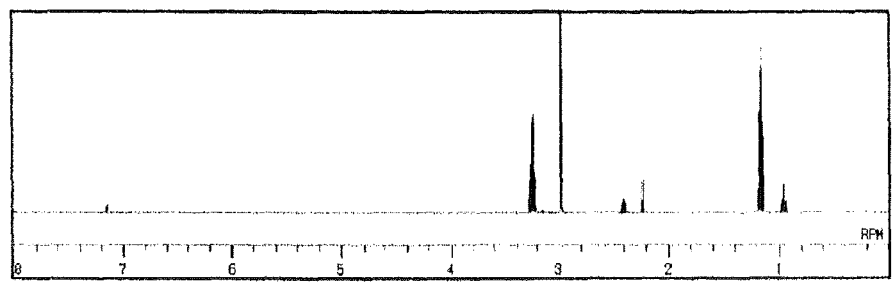

The precursor composition 1 was analyzed by $^1$H-nuclear magnetic resonance ($^1$H-NMR) spectrum. The precursor composition 1 was kept at a room temperature and was analyzed by the 1H-nuclear magnetic resonance ($^1$H-NMR) spectrum. Results are illustrated in FIG. 26. Further, the precursor composition 1 was heated to a temperature of about 130° C. and was kept for about 72 hours. Then, the precursor composition 1 was analyzed by the $^1$H-nuclear magnetic resonance ($^1$H-NMR) spectrum. Results are illustrated in FIG. 27. Hexadeuterobenzene ($C_6D_6$) was used as a solvent, and a 300 MHz nuclear magnetic resonance (NMR) spectrometer was used.

Referring to FIG. 26, the $^1$H-NMR showed chemical shifts (δ) of the precursor composition 1 kept at a room temperature. The $^1$H-NMR showed the spectrum chemical shifts (δ) of the precursor composition 1 kept at a room temperature at δ 3.22-3.27 (2H, q, $NCH_2$—, A), 2.98 (3H, s, $NCH_3$, B), 1.14-1.17 (3H, t, —$CH_3$, C), 2.38-2.42 (2H, m, $NCH_2$—, D), 2.22-2.24 (3H, d, $NCH_3$, E), 0.93-0.97 (3H, t, —$CH_3$, F). That is, the $^1$H-NMR spectrum of the precursor composition 1 showed the chemical shifts of tetrakis(ethylmethylamido)zirconium (TEMAZ) and the chemical shifts of ethyl methyl amine (EMA). From the analysis of the $^1$H-NMR spectrum, it was confirmed that tetrakis(ethylmethylamido)zirconium (TEMAZ) may not react with ethyl methyl amine (EMA) and the precursor composition 1 kept at a room temperature may be kept as in a mixture state of tetrakis(ethylmethylamido)zirconium (TEMAZ) and ethyl methyl amine (EMA).

Referring to FIG. 27, when the precursor composition 1 was heated was heated to a temperature of about 130° C. and was kept for about 72 hours, $^1$H-NMR spectrum showed chemical shifts substantially the same as or substantially similar to those of the $^1$H-NMR spectrum of the precursor composition 1 kept at a room temperature. Accordingly, it is confirmed that tetrakis(ethylmethylamido)zirconium (TEMAZ) included in the precursor composition 1 may not be dissociated.

Experiment 10

A precursor composition 16 was prepared by mixing tetrakis(ethylmethylamido)hafnium (TEMAH), tetrakis(ethylmethylamido)zirconium (TEMAZ), tris(ethylmethlyamino)silane (TEMASi, $SiH(NC_2H_5CH_3)_3$) and ethyl methyl amine (EMA) of a liquid state with a mole ratio of about 1:1:1:1. The precursor composition 16 was kept at a room temperature and was analyzed by 1H-nuclear magnetic resonance ($^1$H-NMR) spectrum. Results are illustrated in FIG. 28.

Figure 29:
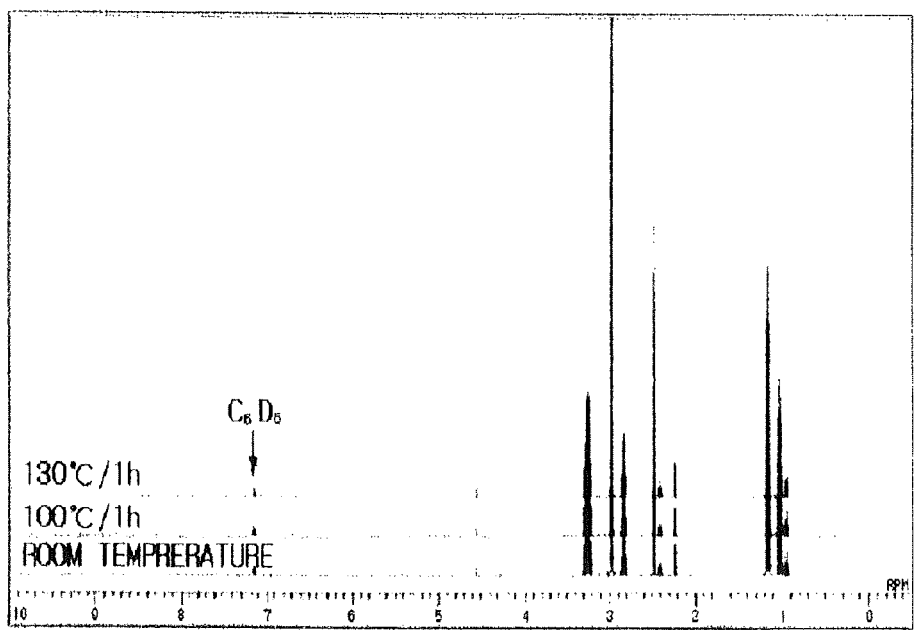

The precursor composition 16 was heated to a temperature of about 100° C. and was kept for about 1 hour. Then, the precursor composition 16 was analyzed by the $^1$H-nuclear magnetic resonance ($^1$H-NMR) spectrum. Further, the precursor composition 16 was heated to a temperature of about 130° C. and was kept for about 1 hour was analyzed by $^1$H-nuclear magnetic resonance ($^1$H-NMR) spectrum. Then, the precursor composition 16 was analyzed by the $^1$H-nuclear magnetic resonance ($^1$H-NMR) spectrum. Results are illustrated in FIG. 29.

Figure 28:
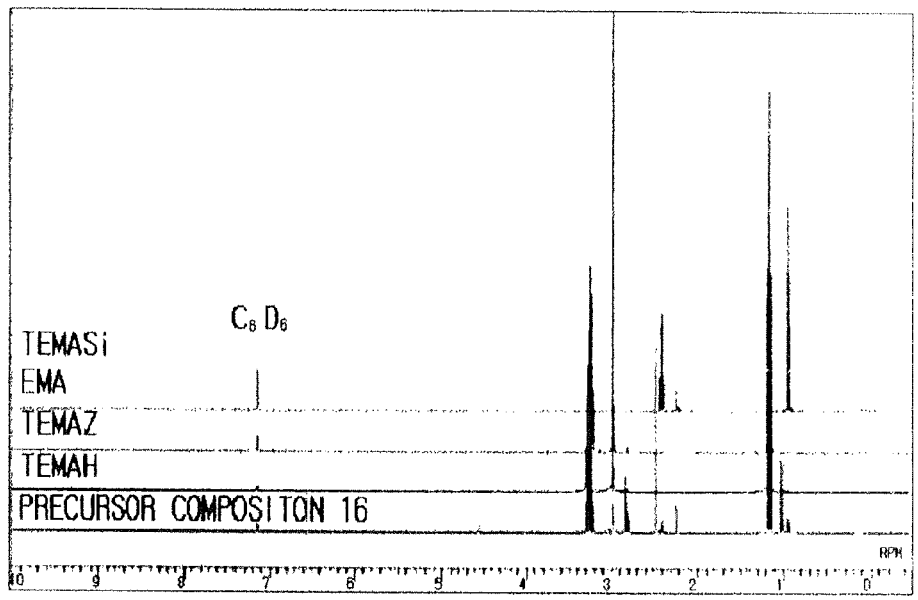

Referring to FIG. 28, the $^1$H-NMR spectrum of the precursor composition 16 showed chemical shifts of tetrakis(ethylmethylamido)hafnium (TEMAH), chemical shifts of tetrakis(ethylmethylamido)zirconium (TEMAZ), chemical shifts of tris(ethylmethlyamino)silane (TEMASi) and the chemical shifts of ethyl methyl amine (EMA). From the analysis of the $^1$H-NMR spectrum, it was confirmed that chemical compounds included in the precursor composition 16 may not react with each other and the precursor composition 16 may be kept as in a mixture state the chemical compounds.

Referring again to FIG. 29, when the precursor composition 16 was heated was heated to a temperature of about 100° C. and was kept for about 1 hour, the $^1$H-NMR spectrum showed chemical shifts substantially the same as or substantially similar to those of the $^1$H-NMR spectrum of the precursor composition 16 kept at a room temperature. Further, when the precursor composition 16 was heated to a temperature of about 130° C. and was kept for about 1 hour, the $^1$H-NMR spectrum showed chemical shifts substantially the same as or substantially similar to those of the $^1$H-NMR spectrum of the precursor composition 16 kept at a room temperature. Accordingly, it is confirmed that precursors included in the precursor composition 16 may not be dissociated at a temperature of about 100° C. to about 130° C.

Experiment 11

Figure 30:
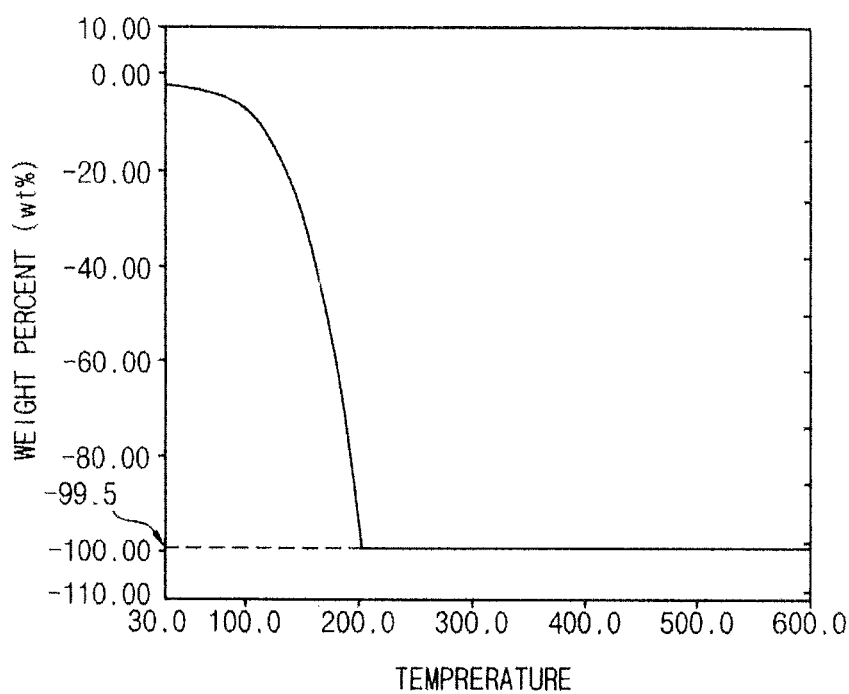

The precursor composition 16 was heated to a temperature of about 130° C., and was kept for about 1 hour. Then, TGA was performed to measure a ratio of solid residues weight with respect to a weight of the precursor composition 16. Results are illustrated in FIG. 30. In performing TGA, the precursor composition 16 was heated from a temperature of about 30° C. to about 400° C. with a ratio of about 10° C./min.

Referring to FIG. 30, in the results of the TGA, about 99.5 weight percent (wt %) of the precursor composition 15 with respect to a total weight of the precursor composition 16 was vaporized, and about 0.05 weight percent (wt %) of the precursor composition 16 was decomposed prior to being vaporized. From the results of the TGA, it was confirmed that precursors such as tetrakis(ethylmethylamido)hafnium (TEMAH) and tetrakis(ethylmethylamido)zirconium (TEMAZ) may be efficiently stabilized and be hardly decomposed prior to being vaporized. Accordingly, it is confirmed that the precursors such as tetrakis(ethylmethylamido) hafnium (TEMAH) and tetrakis(ethylmethylamido)zirconium (TEMAZ) included in the precursor composition 16 including ethyl methyl amine (EMA) may have an improved thermal stability.

Experiment 12

It was observed with naked eyes that a color of a gas line which only vaporized tetrakis(ethylmethylamido)zirconium passed through and a color of a gas line which vaporized tetrakis(ethylmethylamido)zirconium and vaporized ethyl methyl amine simultaneously passed through. Indication of the color on an inner wall of the gas line represents the generation of precipitates caused by dissociation of tetrakis (ethylmethylamido)zirconium.

Tetrakis(ethylmethylamido)zirconium was vaporized in a bubbling system by bubbling tetrakis(ethylmethylamido)zirconium with a carrier gas. The vaporized tetrakis(ethylmethylamido)zirconium passed through the gas lines having a length of about 1 m and having a temperature of about 100° C., about 150° C., about 200° C. and about 250° C., respectively, with the carrier gas. Each of the gas lines was observed with naked eyes to confirm the generation of the precipitates through the change of the color. At the same atmosphere, tetrakis(ethylmethylamido)zirconium and ethyl methyl amine were vaporized in the bubbling system by bubbling tetrakis(ethylmethylamido)zirconium and ethyl methyl amine, respectively, with the carrier gas to introduce vaporized tetrakis(ethylmethyl amido)zirconium and vaporized ethyl methyl amine into the gas lines, respectively. The vaporized tetrakis(ethylmethylamido)zirconium and the vaporized ethyl methyl amine passed through the gas lines with a mole ratio of about 1:1 and 1:17, respectively, to confirm the generation of the precipitates.

Precipitates were deposited on the gas lines, which only vaporized tetrakis(ethylmethylamido)zirconium passed through, from a temperature of about 150° C. Precipitates were deposited on the gas lines which vaporized tetrakis (ethylmethylamido)zirconium and vaporized ethyl methyl amine passed through, from a temperature of about 250° C. Accordingly, it was confirmed that ethyl methyl amine may improve a thermal stability of tetrakis(ethylmethylamido)zirconium of the vapor state.

Evaluation of a Deposition Rate of a Precursor

Experiment 13

A deposition rate of a precursor stabilized by an electron donating compound was evaluated by performing an ALD process. Tetrakis(ethylmethylamido)zirconium (TEMAZ, $Zr(NHCH_3C_2H_5)_4$) was used as the precursor and ethyl methyl amine (EMA, $NHCH_3C_2H_5$) was used as the electron donating compound.

Figure 31:
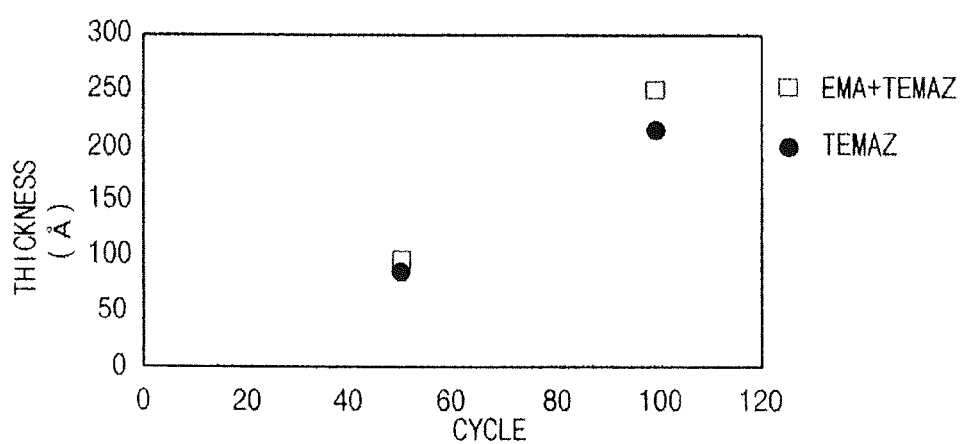

A canister including tetrakis(ethylmethylamido)zirconium was set at a temperature of about 80° C. and a canister including ethyl methyl amine was set at a temperature of about 20° C. A chamber was set at a temperature of about 340° C. After tetrakis(ethylmethylamido)zirconium and ethyl methyl amine were vaporized in a bubbling system, tetrakis(ethylmethylamido)zirconium of the vapor state and ethyl methyl amine of the vapor state were simultaneously introduced with an argon gas as a carrier gas into the chamber during a same time interval. A flow rate of the argon gas was about 1,000 sccm. Then, ozone was introduced as a reactant which was substituted for a ligand of the precursor to form a zirconium oxide layer on a substrate. A thickness of the zirconium oxide layer was measured. Results are illustrated in FIG. 31. At the same atmosphere, an ALD process was performed using only tetrakis(ethylmethylamido)zirconium to measure a thickness of a zirconium oxide layer per a cycle of the ALD process. Results are illustrated in FIG. 31.

Referring to FIG. 31, when the zirconium oxide layer was formed using tetrakis(ethylmethylamido)zirconium stabilized by ethyl methyl amine, the thickness of the zirconium oxide layer is substantially thicker compared to the case using only tetrakis(ethylmethylamido)zirconium. Thus, when the ALD process is performed using both tetrakis(ethylmethylamido)zirconium and ethyl methyl amine, the deposition rate was increased.

Evaluation of Step Coverage

Experiment 14

A step coverage of a layer is evaluated when the layer is formed using a precursor stabilized by an electron donating compound. Tetrakis(ethylmethylamido)zirconium (TEMAZ, $Zr(NHCH_3C_2H_5)_4$) was used as the precursor and ethyl methyl amine (EMA, $NHCH_3C_2H_5$) was used as the electron donating compound.

A canister including tetrakis(ethylmethylamido)zirconium was set at a temperature of about 80° C. and a canister including ethyl methyl amine was set at a temperature of about 20° C. A chamber was set at a temperature of about 340° C. After tetrakis(ethylmethylamido)zirconium and ethyl methyl amine were vaporized in a bubbling system, tetrakis(ethylmethylamido)zirconium of the vapor state and ethyl methyl amine of the vapor state were simultaneously introduced with an argon gas as a carrier gas into the chamber for about 8 seconds. A flow rate of the argon gas was about 1,000 sccm. Then, ozone was introduced as a reactant which was substituted for a ligand of the precursor to form a dielectric layer 1 including zirconium oxide on a cylindrical lower electrode having an aspect ratio of about 20:1. At the same atmosphere, a dielectric layer 2 including zirconium oxide was formed on a cylindrical lower electrode having an aspect ratio of about 20:1 using only tetrakis(ethylmethylamido)zirconium. The dielectric layer 1 and the dielectric layer 2 were inspected using a scanning electron microscope (SEM). Results are illustrated in FIGS. 32 and 33.

Figure 32:
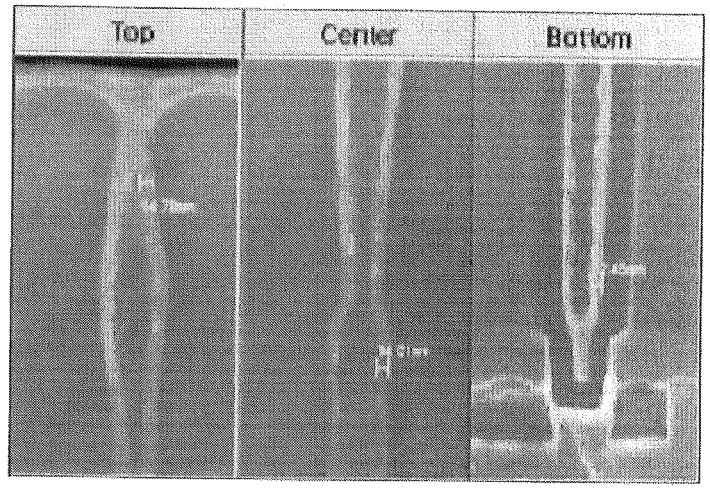
Figure 33:
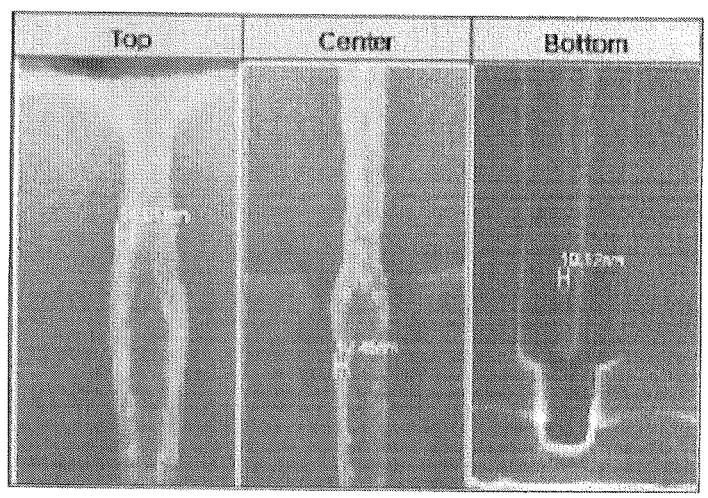

Referring to FIGS. 32 and 33, the dielectric layer 1 was uniformly formed on a bottom of a lower electrode in FIG. 32. However, the dielectric layer 2 was not uniformly formed on a bottom of a lower electrode in FIG. 33. Further, a thickness of the dielectric layer 1 on a top of the lower electrode was about 14.79 nm and a thickness of the dielectric layer on the bottom of the lower electrode was about 12.45 nm in FIG. 32 and it was confirmed that the dielectric layer 1 had a uniform thickness. A thickness of the dielectric layer 2 on a top of the lower electrode was about 14.01 nm and a thickness of the dielectric layer 2 on the bottom of the lower electrode was about 10.32 nm in FIG. 33 and it was confirmed that the thickness of the dielectric layer 2 was not uniform. Thus, it was confirmed that when tetrakis(ethylmethylamido)zirconium was stabilized by ethyl methyl amine, a step coverage of the dielectric layer 1 including zirconium oxide was improved and the dielectric layer 1 having a uniform thickness was formed.

Experiment 15

A step coverage of a layer is evaluated when the layer is formed using a precursor stabilized by an electron donating compound. Tetrakis(ethylmethylamido)zirconium (TEMAZ, $Zr(NHCH_3C_2H_5)_4$) was used as the precursor and ethyl methyl amine (EMA, $NHCH_3C_2H_5$) was used as the electron donating compound.

A canister including tetrakis(ethylmethylamido)zirconium was set at a temperature of about 90° C. and a canister including ethyl methyl amine was set at a temperature of about 20° C. A chamber was set at a temperature of about 290° C. Tetrakis(ethylmethylamido)zirconium and ethyl methyl amine were vaporized in a bubbling system. After ethyl methyl amine of the vapor state was introduced into the chamber for about 5 seconds, tetrakis(ethylmethylamido)zirconium of the vapor state was introduced into the chamber for about 20 seconds. An argon gas having a flow rate of about 1,000 sccm was used as a carrier gas. Then, ozone was introduced as a reactant which was substituted for a ligand of the precursor to form a dielectric layer 3 including zirconium oxide on a cylindrical lower electrode having an aspect ratio of about 20:1. At the same atmosphere, a dielectric layer 4 including zirconium oxide was formed on a cylindrical lower electrode having an aspect ratio of about 20:1 using only tetrakis(ethylmethylamido)zirconium. The dielectric layer 3 and the dielectric layer 4 were inspected using a scanning electron microscope (SEM). Results are illustrated in FIGS. 34 and 35.

Figure 34:
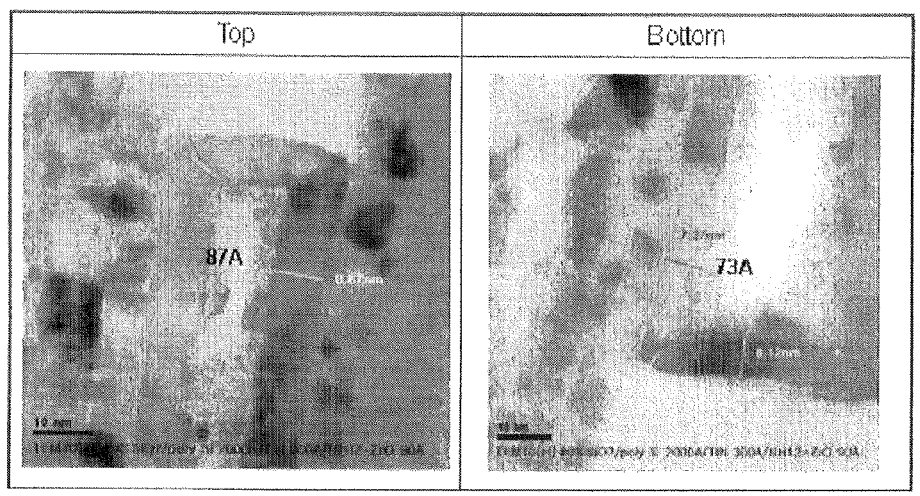
Figure 35:
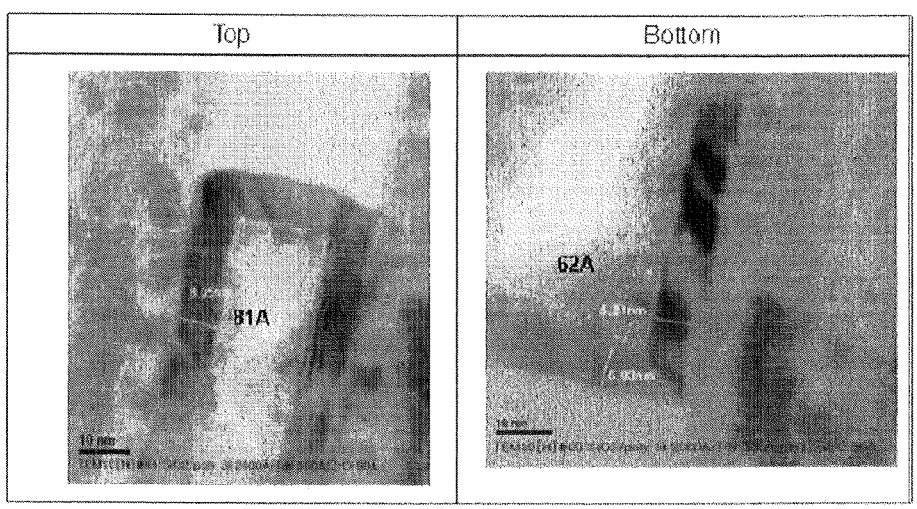

Referring to FIGS. 34 and 35, a thickness of the dielectric layer 3 on a top of the lower electrode was about 8.7 nm and a thickness of the dielectric layer 3 on the bottom of the lower electrode was about 7.3 nm in FIG. 34. A thickness of the dielectric layer 4 on a top of the lower electrode was about 8.1 nm and a thickness of the dielectric layer 4 on the bottom of the lower electrode was about 6.2 nm in FIG. 35. Thus, it was confirmed that when tetrakis(ethylmethylamido)zirconium was stabilized by ethyl methyl amine, a step coverage of the dielectric layer 3 including zirconium oxide was improved and the dielectric layer 3 having a uniform thickness was formed.

Experiment 16

A dielectric layer 5 including zirconium oxide was formed using cyclopentadienyl-tris(dimethylamido)zirconium $((C_5H_5)Zr(N(CH_3)_2)_3)$ as the precursor and methanol $(CH_3OH)$ as the electron donating compound by performing substantially the same processes as those of Experiment 15. At the same atmosphere, a dielectric layer 6 including zirconium oxide was formed using only cyclopentadienyl-tris (dimethylamido)zirconium.

Figure 36:
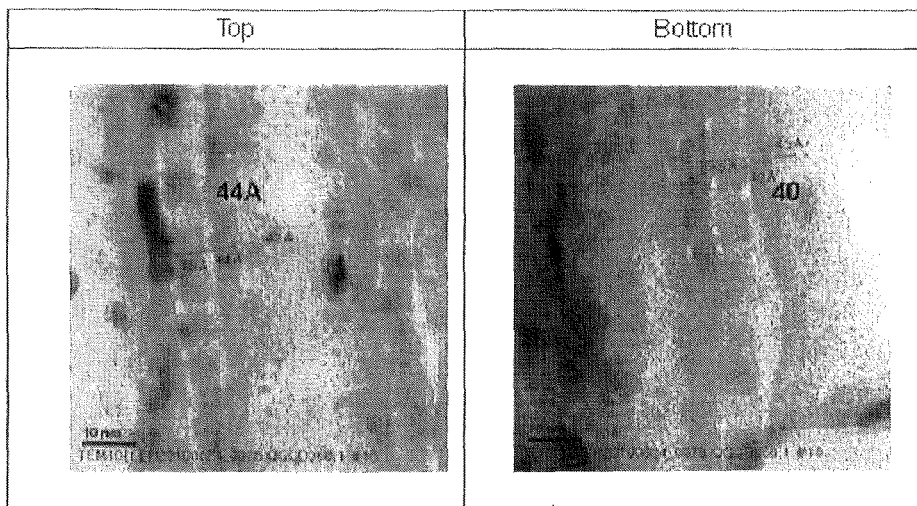
Figure 37:
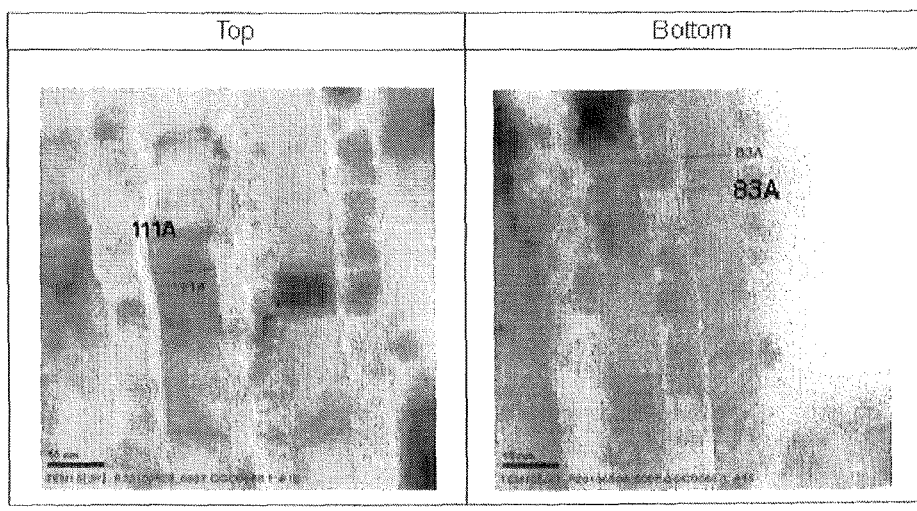

Referring to FIGS. 36 and 37, a thickness of the dielectric layer 5 on a top of the lower electrode was about 4.4 nm and a thickness of the dielectric layer 5 on the bottom of the lower electrode was about 4.0 nm in FIG. 36. A thickness of the dielectric layer 6 on a top of the lower electrode was about 11.1 nm and a thickness of the dielectric layer 6 on the bottom of the lower electrode was about 8.3 nm in FIG. 36. Thus, it was confirmed that when cyclopentadienyl-tris(dimethylamido)zirconium was stabilized by methanol, a step coverage of the dielectric layer 5 including zirconium oxide was improved and the dielectric layer 5 having a uniform thickness was formed.

Experiment 17

A dielectric layer 7 including zirconium oxide was formed using tetrakis(ethylmethylamido)zirconium as the precursor and butanol $(CH_3(CH2)_3OH)$ as the electron donating compound by performing substantially the same processes as those of Experiment 15. At the same atmosphere, a dielectric layer 8 including zirconium oxide was formed using only tetrakis(ethylmethylamido)zirconium.

Figure 38:
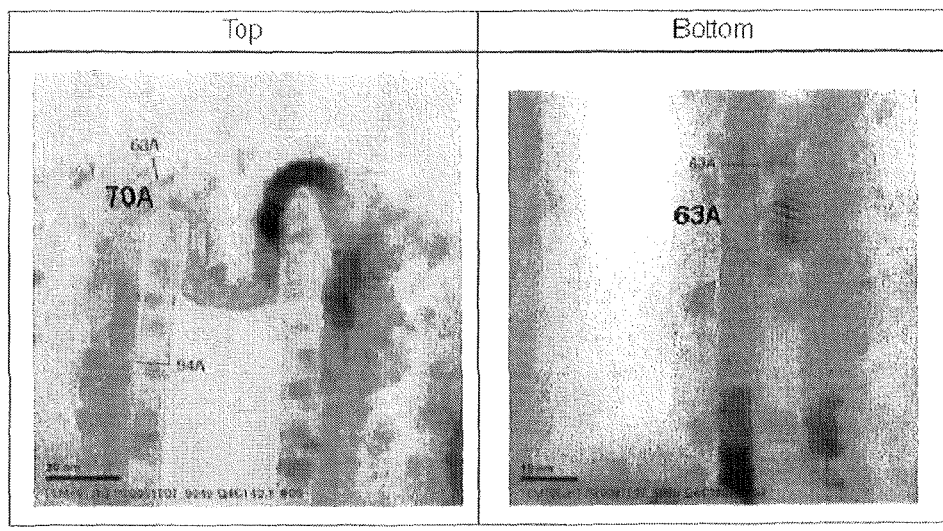
Figure 39:
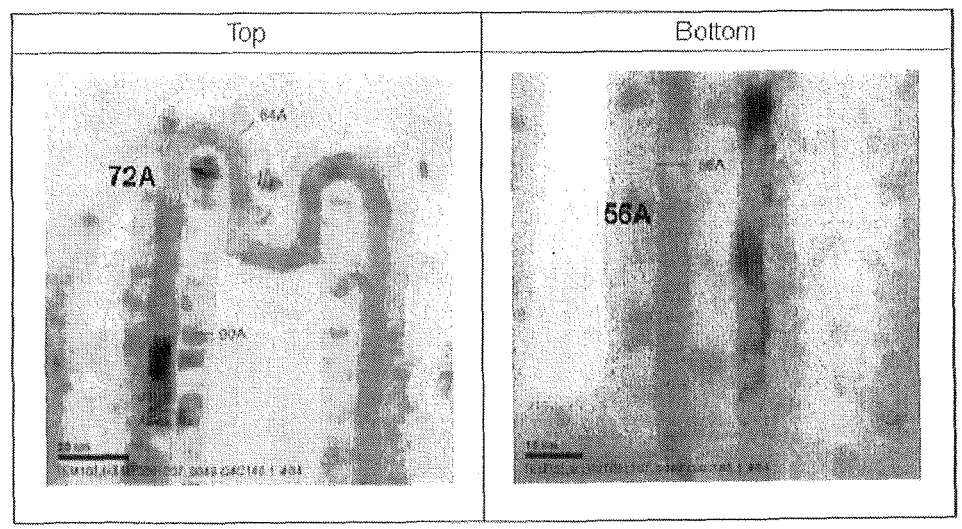

Referring to FIGS. 38 and 39, a thickness of the dielectric layer 7 on a top of the lower electrode was about 7.0 nm and a thickness of the dielectric layer 7 on the bottom of the lower electrode was about 6.3 nm in FIG. 38. A thickness of the dielectric layer 8 on a top of the lower electrode was about 7.2 nm and a thickness of the dielectric layer 8 on the bottom of the lower electrode was about 5.6 nm in FIG. 39. Thus, it was confirmed that when tetrakis(ethylmethylamido)zirconium was stabilized by butanol, a step coverage of the dielectric layer 7 including zirconium oxide was improved and the dielectric layer 7 having a uniform thickness was formed.

According to example embodiments, the precursor stabilized by the electron donating compound may have an improved thermal stability. That is, the precursor stabilized by the electron donating compound may not be dissociated at a high temperature atmosphere. Accordingly, when the layer is formed using the precursor stabilized by the electron donating compound, the precursor may be uniformly diffused into the lower portion of the hole, the trench, the gap or the recess without dissociation of the precursor. As a result, the layer having a good step coverage may be efficiently formed on an object and thus a semiconductor device having an improved stability and reliability may be manufactured.

Evaluation of a Leakage Current

Experiment 18

While a voltage of less than about 4V was repeatedly applied to the dielectric layer 1 and the dielectric layer 2 prepared according to Experiment 14, respectively, a leakage current of the dielectric layer 1 and leakage currents of the dielectric layer 2 were measured. The number of times that the voltage was applied was counted until the leakage current was rapidly increased. Results are illustrated in Table 6.

Referring to Table 6, although the voltage was applied to the dielectric layer 1 formed by simultaneously introducing tetrakis(ethylmethylamido)zirconium of a vapor state and ethyl methyl amine of a vapor state for more than about 50 times, the leakage current was not rapidly increased. However, when the voltage was applied to the dielectric layer 2 formed by introducing tetrakis(ethylmethylamido)zirconium without ethyl methyl amine for about 7 times, the leakage current was rapidly increased.

Accordingly, it was confirmed that when a dielectric layer was formed using tetrakis(ethylmethylamido)zirconium stabilized by ethyl methyl amine, the dielectric layer may have improved electrical characteristics.

Experiment 19

A dielectric layer 9 and a dielectric layer 10 were formed using the precursor composition 1 and the comparative composition 1, respectively. Then, leakage current characteristics of the dielectric layers 9 and 10 were evaluated.

A canister including the precursor composition 1 was set at a temperature of 20° C. and a chamber was set at a temperature of about 340° C. After the precursor composition 1 vaporized in a bubbling system, the precursor composition 1 of a vapor state was introduced with an argon gas as a carrier gas into the chamber for about 8 seconds. A flow rate of the argon gas was about 1,000 sccm. Then, ozone was introduced as a reactant which was substituted for a ligand of a precursor included in the precursor composition 1 to form the dielectric layer 9 including zirconium oxide on a cylindrical lower electrode having an aspect ratio of about 20:1. The dielectric layer 10 was formed by a method substantially the same as the above described method of forming the dielectric layer 9 except for using the comparative composition 1.

While a voltage of less than about 4V was repeatedly applied to the dielectric layer 9 and the dielectric layer 10, respectively, leakage currents of the dielectric layer 9 and a leakage current of the dielectric layer 10 were measured. The number of times that the voltage was applied was counted until the leakage current was rapidly increased. Results are illustrated in Table 6.

Referring to Table 6, although the voltage was applied to the dielectric layer 9 formed using the precursor composition 1 including tetraki(-ethylmethylamido)zirconium (TEMAZ) and ethyl methyl amine (EMA) with a mole ratio of about 1:1 for more than about 20 times, the leakage current was not rapidly increased. However, when the voltage was applied to the dielectric layer 10 formed using the comparative composition 1 including tetrakis(ethylmethylamido)zirconium (TEMAZ) without ethyl methyl amine (EMA) for about 11 times, the leakage current was rapidly increased.

Accordingly, it was confirmed that when a dielectric layer was formed using the precursor composition including tetrakis(ethylmethylamido)zirconium and methyl amine, the dielectric layer may have improved electrical characteristics.

Experiment 20

Dielectric layers were formed using precursor compositions including three types of precursors. Then, leakage current characteristics of the dielectric layers were evaluated.

A canister including solution prepared by mixing tetrakis(ethylmethylamido)zirconium (TEMAZ) and tetrakis(ethylmethylamido)hafnium (TEMAH) with a mole ratio of about 2:1 was set at a temperature of about 80° C. and a canister including tris(ethylmethlyamino)silane (TEMASi) was set at a temperature of about 120° C. Further, a canister including ethyl methyl amine (EMA) was set at a temperature of about 20° C. A chamber was set at a temperature of about 280° C.

After the solution including tetrakis(ethylmethylamido)zirconium and tetrakis(ethylmethylamido)hafnium, and ethyl methyl amine were vaporized in a bubbling system, respectively, tetrakis(ethylmethylamido)zirconium of a vapor state, tetrakis(ethylmethylamido)hafnium of a vapor state and ethyl methyl amine of a vapor state were simultaneously introduced with an argon gas as a carrier gas into the chamber for about 8 seconds. A flow rate of the argon gas was about 1,000 sccm. Then, after tris(ethylmethlyamino)silane was vaporized in a bubbling system, tris(ethylmethlyamino)silane of a vapor state was introduced with an argon gas as a carrier gas into the chamber for about 2 seconds. A flow rate of the argon gas was about 1,000 sccm.

Then, ozone was introduced as a reactant which was substituted for a ligand of the precursors such as tetrakis(ethylmethylamido)zirconium, tetrakis(ethylmethylamido)hafnium and tris(ethylmethlyamino)silane to form a dielectric layer 11 including zirconium-hafnium silicate on a cylindrical lower electrode having an aspect ratio of about 20:1. A dielectric layer 12 was formed by a method substantially the same as the above described method of forming the dielectric layer 11 except for not using ethyl methyl amine.

While a voltage of less than about 4V was repeatedly applied to the dielectric layer 11 and the dielectric layer 12, respectively, leakage currents of the dielectric layer 11 and a leakage current of the dielectric layer 12 were measured. The number of times that the voltage was applied was counted until the leakage current was rapidly increased. Results are illustrated in Table 6.

Referring to Table 6, although the voltage was applied to the dielectric layer 11 formed by simultaneously introducing tetrakis(ethylmethylamido)zirconium of a vapor state, tetrakis(ethylmethylamido)hafnium of a vapor state and ethyl methyl amine of a vapor state for more than about 50 times, the leakage current was not rapidly increased. However, when the voltage was applied to the dielectric layer 12 formed without introducing ethyl methyl amine of a vapor state for about 18 times, the leakage current was rapidly increased.

Accordingly, it was confirmed that when a dielectric layer including at least one metal compound was formed using at least one precursor and ethyl methyl amine, the dielectric layer may have improved electrical characteristics.

TABLE 6

| | Dielectric layer 1 | Dielectric layer 2 | Dielectric layer 9 | Dielectric layer 10 | Dielectric layer 11 | Dielectric layer 12 |
|---|---|---|---|---|---|---|
| The number of times applying the voltage | More than 50 | 7 | More than 20 | 11 | More than 50 | 18 |

According to example embodiments, the precursor stabilized by the electron donating compound may have an improved thermal stability. That is, the precursor stabilized by the electron donating compound may not be dissociated at a high temperature atmosphere. Accordingly, when the layer is formed using the precursor stabilized by the electron donating compound, the precursor may be uniformly diffused into the lower portion of the hole, the trench, the gap or the recess without dissociation of the precursor. As a result, the layer having a good step coverage may be efficiently formed on an object and thus a semiconductor device having an improved stability and reliability may be manufactured.

The foregoing is illustrative of example embodiments and is not to be construed as limiting thereof. Although a few example embodiments have been described, those skilled in the art will readily appreciate that many modifications are possible in the example embodiments without materially departing from the novel teachings of example embodiments. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it may be to be understood that the foregoing may be illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a layer, the method comprising:
   stabilizing a precursor composition by contacting the precursor composition with an electron donating compound to provide a stabilized precursor composition onto a substrate, the precursor composition including a metal and a ligand chelating to the metal; and
   introducing a reactant onto the substrate to bind to the metal in the stabilized precursor composition,
   wherein providing the stabilized precursor composition onto the substrate includes introducing the precursor composition onto the substrate after the electron donating compound is introduced onto the substrate in the absence of any precursor composition,
   and wherein the electron donating compound is continuously introduced onto the substrate during and after the precursor composition is introduced.

2. The method of claim 1, wherein the precursor composition includes a first precursor having a first metal and a first ligand and a second precursor having a second metal and a second ligand.

3. The method of claim 2, wherein the first and second metals include zirconium (Zr) or hafnium (Hf).

4. The method of claim 2, further comprising introducing a third precursor onto the substrate after introducing the precursor composition onto the substrate, the third precursor having a third metal and a third ligand.

5. The method of claim 4, wherein the third metal includes silicon (Si).

6. A method of forming a layer, the method comprising:
   stabilizing a precursor by contacting the precursor with an electron donating compound to provide a stabilized precursor onto a substrate, the precursor including a metal and a ligand chelating to the metal; and
   introducing a reactant onto the substrate to bind to the metal in the stabilized precursor,
   wherein the metal includes zirconium or hafnium and the electron donating compound includes alcohol having a carbon atom of about 1 to about 10;
   wherein providing the stabilized precursor onto the substrate includes introducing the precursor onto the substrate after the electron donating compound is introduced onto the substrate in the absence of any precursor; and
   wherein the electron donating compound is continuously introduced onto the substrate during and after the precursor is introduced.

7. A method of forming a layer, the method comprising:
   stabilizing a precursor by contacting the precursor with an electron donating compound to provide a stabilized precursor onto a substrate, the precursor including a metal and a ligand chelating to the metal; and
   introducing a reactant onto the substrate to bind to the metal in the stabilized precursor,
   wherein the precursor includes at least one precursor selected from the group consisting of tetrakis-ethylmethylamido-zirconium (Zr(NCH3C2H5)4), tetrakis-ethylmethylamido-hafnium (Hf(NCH3C2H5)4), tetrakis-diethylamido-zirconium (Zr(N(C2H5)2)4), tetrakis-diethylamido-hafnium (Hf(N(C2H5)2)4), tetrakis-dimethylamido-zirconium (Zr(N(CH3)2)4), tetrakis-dimethylamido-hafnium (Hf(N(CH3)2)4), tetrakis-ethyldimethylamine-zirconium (Zr(N(CH3)2C2H5)4), tetrakis-ethyldimethylamine-hafnium (Hf(N(CH3)2C2H5)4), tetrakis-diethylmethylamine-zirconium (Zr(N(C2H5)2CH3)4), tetrakis-diethylmethylamine-hafnium (Hf(N(C2H5)2CH3)4), tetrakis-triethylamine-zirconium (Zr(N(C2H5)3)4), tetrakis-triethylamine-hafnium (Hf(N(C2H5)3)4), cyclopentadienyl-tris(dimethylamido)zirconium ((C5H5)Zr(N(CH3)2)3), cyclopentadienyl-tris(dimethylamido)hafnium ((C5H5)Hf(N(CH3)2)3), cyclopentadienyl-tris(ethylmethylamido)zirconium ((C5H5)Zr(N(C2H5)(CH3))3) and cyclopentadienyl-tris(ethylmethylamido)hafnium ((C5H5)Hf(N(C2H5)(CH3))3);
   wherein providing the stabilized precursor onto the substrate includes introducing the precursor onto the substrate after the electron donating compound is introduced onto the substrate in the absence of any precursor; and
   wherein the electron donating compound is continuously introduced onto the substrate during and after the precursor is introduced.

8. A method of forming a layer, the method comprising:
   providing a first precursor onto a substrate, the first precursor including a first metal and a first ligand chelating to the first metal;
   providing a second precursor onto the substrate, the second precursor including a second metal and a second ligand chelating to the second metal;
   providing an electron donating compound onto the substrate to stabilize the first and second precursors, which are provided onto the substrate after the electron donating compound is initially introduced onto the substrate in the absence of any precursor, said providing an electron donating compound further comprising continuously introducing the electron donating compound onto the substrate during and after the first and second precursors are introduced; and
   providing a reactant having nitrogen onto the substrate to form a metal nitride layer thereon.

9. The method of claim 8, wherein providing the first precursor, providing the second precursor and providing the electron donating compound comprises:
   mixing the first precursor, the second precursor and the electron donating compound to prepare a mixture composition; and
   vaporizing the mixture composition to provide stabilized precursors onto the substrate.

10. The method of claim 8, further comprising providing a third precursor onto the substrate, the third precursor including a third metal and a third ligand chelating to the third metal.

11. The method of claim 10, wherein the third metal includes silicon.

12. The method of claim 10, wherein providing the first precursor, providing the second precursor, providing the third precursor and providing the electron donating compound comprises:
   simultaneously providing the first precursor and the second precursor during a same time interval;
   providing the electron donating compound after providing the first and the second precursors; and
   providing the third precursor after providing the electron donating compound.

13. The method of claim 10, wherein providing the first precursor, providing the second precursor, providing the third precursor and providing the electron donating compound comprises:
   simultaneously providing the first precursor, the second precursor and the electron donating compound during a same time interval; and providing the third precursor after providing the first precursor, the second precursor and the electron donating compound.

14. The method of claim 10, wherein providing the first precursor, providing the second precursor, providing the third precursor and providing the electron donating compound comprises:
   simultaneously providing the first precursor and the second precursor during a same time interval;
   providing the third precursor after providing the first and the second precursors; and
   providing the electron donating compound after providing the third precursor.

* * * * *